(12) United States Patent
Yamazaki et al.

(10) Patent No.: US 10,032,428 B2
(45) Date of Patent: Jul. 24, 2018

(54) SEMICONDUCTOR DEVICE, DISPLAY DEVICE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP);
Hiroyuki Miyake, Kanagawa (JP);
Daisuke Matsubayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 166 days.

(21) Appl. No.: 15/223,659

(22) Filed: Jul. 29, 2016

(65) Prior Publication Data

US 2016/0335979 A1    Nov. 17, 2016

Related U.S. Application Data

(62) Division of application No. 14/090,209, filed on Nov. 26, 2013, now Pat. No. 9,412,764.

(30) Foreign Application Priority Data

Nov. 28, 2012   (JP) .................................. 2012-259260

(51) Int. Cl.
*G09G 3/36*       (2006.01)
*H01L 27/12*      (2006.01)

(52) U.S. Cl.
CPC .......... *G09G 3/3696* (2013.01); *G09G 3/3677* (2013.01); *G09G 3/3688* (2013.01); *H01L 27/124* (2013.01); *H01L 27/1225* (2013.01); *G09G 2300/043* (2013.01); *G09G 2310/0286* (2013.01); *G09G 2320/0214* (2013.01); *G09G 2330/00* (2013.01)

(58) Field of Classification Search
CPC ..... G09G 3/36; G09G 3/3677; H01L 27/1225
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1 737 044 A1   12/2006
EP   2 226 847 A2   9/2010
(Continued)

OTHER PUBLICATIONS

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

(Continued)

*Primary Examiner* — Hai L Nguyen
(74) *Attorney, Agent, or Firm* — Husch Blackwell LLP

(57) ABSTRACT

To prevent an influence of normally-on characteristics of the transistor which a clock signal is input to a terminal of, a wiring to which a first low power supply potential is applied and a wiring to which a second low power supply potential lower than the first low power supply potential is applied are electrically connected to a gate electrode of the transistor. A semiconductor device including the transistor can operate stably.

5 Claims, 21 Drawing Sheets

(56) References Cited

U.S. PATENT DOCUMENTS

| | | |
|---|---|---|
| 6,064,713 A | 5/2000 | Lebrun et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,870,401 B1 | 3/2005 | Kasuga et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,310,402 B2 | 12/2007 | Wei et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,710,384 B2 * | 5/2010 | Azami ................ G09G 3/3688 345/100 |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,174,479 B2 | 5/2012 | Murakami et al. |
| 8,274,077 B2 | 9/2012 | Akimoto et al. |
| 8,369,478 B2 | 2/2013 | Miyake |
| 8,466,463 B2 | 6/2013 | Akimoto et al. |
| 8,963,823 B2 * | 2/2015 | Zhou ........................ G09G 3/36 345/100 |
| 9,014,326 B2 * | 4/2015 | Murakami ............ G09G 3/3677 327/210 |
| 9,024,930 B2 * | 5/2015 | Nagao .................. G09G 3/3648 345/100 |
| 9,361,845 B2 | 6/2016 | Pyoun et al. |
| 9,672,782 B2 | 6/2017 | Lee et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0134090 A1 | 6/2011 | Iwamoto et al. |
| 2016/0284306 A1 | 9/2016 | Pyoun et al. |
| 2017/0270885 A1 | 9/2017 | Lee et al. |

FOREIGN PATENT DOCUMENTS

| | | |
|---|---|---|
| EP | 2 341 507 A1 | 7/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-234580 A | 9/2005 |
| JP | 2006-127751 A | 5/2006 |
| JP | 2007-096055 A | 4/2007 |
| JP | 2007-114781 A | 5/2007 |
| JP | 2007-123861 A | 5/2007 |

(56) References Cited

FOREIGN PATENT DOCUMENTS

| JP | 2011-205627 A | 10/2011 |
|---|---|---|
| WO | WO 2004/114391 A1 | 12/2004 |
| WO | WO 2010/050262 A1 | 5/2010 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition: The 'Blue Phase'," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H-N. et al., "Current Status of, Challenges to, and Perspective View of AM-OLED," IDW '06: Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID Interantional Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2009, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

(56) References Cited

OTHER PUBLICATIONS

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M-S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4) :a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J.-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J.-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K.-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

\* cited by examiner

SEMICONDUCTOR DEVICE, DISPLAY DEVICE, AND ELECTRONIC DEVICE

This application is a divisional of copending U.S. application Ser. No. 14/090,209, filed on Nov. 26, 2013 which is incorporated herein by reference.

BACKGROUND OF THE INVENTION

1. Field of the Invention

One embodiment of the present invention relates to a semiconductor device, a display device, a light-emitting device, a driving method thereof, or a driving method thereof. In particular, one embodiment of the present invention relates to a pulse signal output circuit and a shift register. One embodiment of the present invention relates to a display device and an electronic device which include the pulse signal output circuit and the shift register.

2. Description of the Related Art

Transistors which are used for most flat panel displays typified by liquid crystal display devices and light-emitting display devices include silicon semiconductors such as amorphous silicon, single crystal silicon, and polycrystalline silicon in many cases.

Although transistors including amorphous silicon have low field effect mobility, they can be formed over larger glass substrates. In contrast, although transistors including polycrystalline silicon have high field effect mobility, they need a crystallization process such as laser annealing and are not always suitable for larger glass substrates.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor. For example, Patent Documents 1 and 2 disclose a technique by which a transistor is formed using zinc oxide or an In—Ga—Zn—O-based oxide semiconductor as a semiconductor material and is used as a switching element of an image display device.

Further, such transistors including oxide semiconductors can be used as switching elements included in pixel portions and driver circuits of display devices such as liquid crystal displays, electroluminescent displays, and electronic paper. For example, Patent Document 3 discloses a technique in which a driver circuit is formed using a shift register and the like including a pulse signal output circuit, and a transistor including the above oxide semiconductor is used as a transistor in the pulse signal output circuit.

REFERENCE

[Patent Document 1] Japanese Published Patent Application No. 2007-123861

[Patent Document 2] Japanese Published Patent Application No. 2007-96055

[Patent Document 3] Japanese Published Patent Application No. 2011-205627

SUMMARY OF THE INVENTION

In the case where a shift register including a pulse signal output circuit and included in the driver circuit includes transistors having the same polarity, the shift register might have a problem of unstable operation, for example. For example, conventional pulse signal output circuits have a problem of variation in electrical characteristics of a transistor when the transistor deteriorates owing to high amplitude of a clock signal.

In addition, long-time application of stress to a transistor causes a shift in the threshold voltage (also referred to as Vth) of the transistor in some cases. For example, by continuous application of positive voltage to a drain electrode of an n-channel transistor, the threshold voltage of the n-channel transistor shifts in negative direction with time. In such a case, a problem of turning on the transistor even when a gate voltage is 0 V, that is, becoming normally-on is caused.

In view of the above problems, an object of one embodiment of the present invention is to prevent deterioration in a transistor. An object of one embodiment of the present invention is to normally drive a circuit including a transistor. An object of one embodiment of the present invention is to reduce leakage current of a transistor to prevent an influence of normally-on characteristics of a transistor. An object of one embodiment of the present invention is to provide highly reliable display device. An object of one embodiment of the present invention is to provide a pulse signal output circuit showing stable electrical characteristics.

Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

A second low power supply potential is applied to a gate electrode of a transistor electrically connected to a terminal to which the clock signal is input. The second low power supply potential is lower than a first low power supply potential which is supplied to the clock signal. By application of the second low power supply potential to the gate electrode of the transistor, a semiconductor device which stably operates is obtained. The structure is more specifically described below.

One embodiment of the present invention is a semiconductor device which includes a first input terminal to which a start pulse signal is input; a second input terminal to which a clock signal is input, a third input terminal to which a reset signal is input, an output terminal from which a pulse signal is output, a first transistor, a second transistor, and a third transistor. A first terminal of the first transistor is electrically connected to the first input terminal. A second terminal of the first transistor is electrically connected to a gate electrode of the second transistor. A gate electrode of the first transistor is electrically connected to the first terminal of the first transistor. A first terminal of the second transistor is electrically connected to the second input terminal. A second terminal of the second transistor is electrically connected to a first terminal of the third transistor and the output terminal. A second terminal of the third transistor is electrically connected to a wiring to which a first low power supply potential is applied. A gate electrode of the third transistor is electrically connected to the third input terminal. The first low power supply potential and a high power supply potential are applied to the gate electrode of the first transistor with the start pulse signal, and a second low power supply potential which is lower than the first low power supply potential is applied to the gate electrode of the second transistor when the first low power supply potential is applied to the gate electrode of the first transistor.

According to one embodiment of the present invention, deterioration of a transistor can be prevented. According to one embodiment of the present invention, a circuit including a transistor can normally operate. According to one embodiment of the present invention, an influence of normally-on characteristics of a transistor is prevented and leakage current of the transistor can be reduced. According to one embodiment of the present invention, a pulse signal output circuit showing stable electrical characteristics can be provided.

A highly reliable display device can be provided by using a pulse signal output circuit and a shift register of one embodiment of the present invention.

DETAILED DESCRIPTION OF THE INVENTION

Figure 1A:
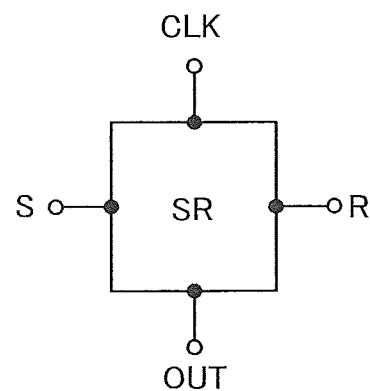
FIGS. 1A to 1C illustrate pulse signal output circuits of one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, a size of each component or a thickness of each layer or an area is exaggerated in some cases for clarification. Therefore, embodiments of the present invention are not limited to such scales.

In this specification and the like, ordinal numbers such as "first", "second", and "third" are used in order to avoid confusion among components, and the terms do not limit the components numerically.

Embodiment 1

In this embodiment, a pulse signal output circuit of one embodiment of the present invention and a shift register including the pulse signal output circuit will be described with reference to FIGS. 1A to 1C, FIGS. 2A to 2F, FIGS. 3A and 3B, FIGS. 4A and 4B, and FIG. 5.

Figure 1B:
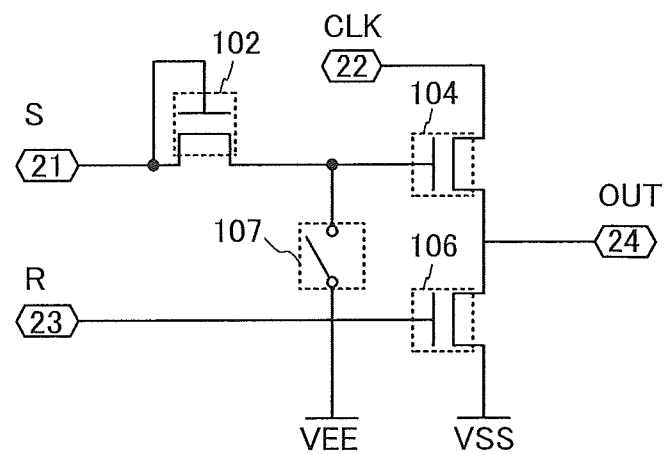
Figure 1C:
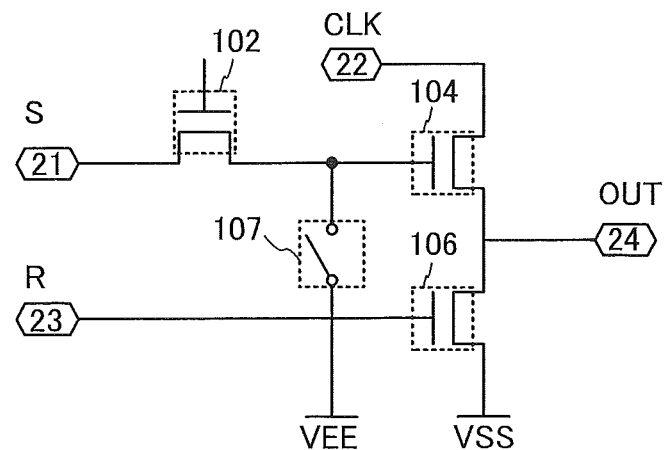

FIGS. 1A to 1C illustrate examples of a pulse signal output circuit of this embodiment. As in FIG. 1A, a pulse signal output circuit has a function of generating a pulse signal (an output signal OUT) in accordance with a set signal S, a reset signal R, and a clock signal CLK, which are input to the pulse signal output circuit. Note that plural kinds of clock signals may be input to the pulse signal output circuit.

The pulse signal output circuit illustrated in FIG. 1A can have a structure of a pulse signal output circuit illustrated in FIG. 1B, for example. The pulse signal output circuit illustrated in FIG. 1B includes a first input terminal 21 to which the set signal S is input, a second input terminal 22 to which the clock signal CLK is input, a third input terminal 23 to which the reset signal R is input, a first output terminal 24 from which a pulse signal is output, a transistor 102, a transistor 104, a transistor 106, and a switching element 107.

For example, the transistors 102, 104, and 106 can be transistors having the same conductivity type. The switching of the transistors is controlled in accordance with one or more of the set signal S, the reset signal R, and the clock signal CLK. As the set signal S, for example, a start pulse signal SP can be used. The switching of the switching element 107 is controlled in accordance with a second low power supply potential VEE. The switching element 107 is an element performing switching in accordance with an electric signal, such as a relay, a transistor, or a diode. Thus, the switching element 107 can have the same conductivity type as that of the transistors 102, 104, and 106, for example.

In FIG. 1B, a first terminal of the transistor 102 is connected to a gate electrode of the transistor 102. Note that the structure is not limited thereto, and as in FIG. 1C, the gate electrode of the transistor 102 may be electrically connected to another wiring or the like, for example.

The pulse signal output circuits illustrated in FIGS. 1B and 1C may have the structures in FIGS. 2A to 2F, for example. Note that in the pulse signal output circuits illustrated in FIGS. 2A to 2F, a transistor is used as the switching element 107, for example.

The structures illustrated in FIGS. 2A to 2D can be formed by changing the connection portions of the transistor 102 and the switching element 107 in the pulse signal output circuits illustrated in FIGS. 1B and 1C.

Figure 2A:
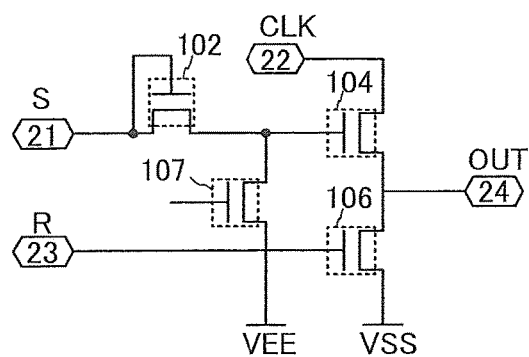
FIGS. 2A to 2F illustrate pulse signal output circuits of one embodiment of the present invention.
Figure 2B:
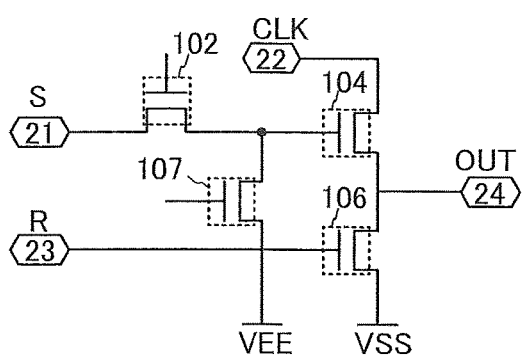
Figure 2C:
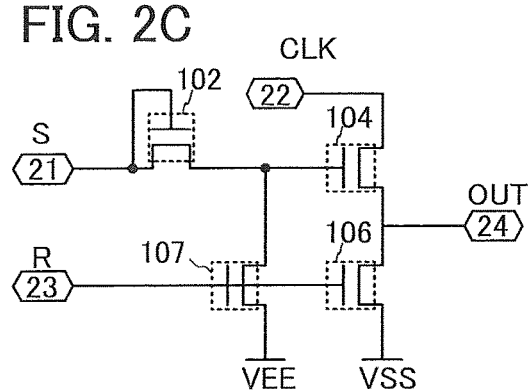
Figure 2D:
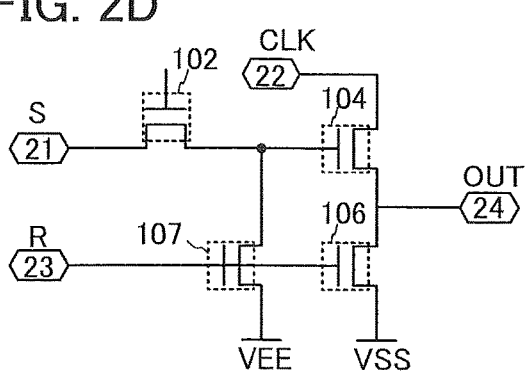
Figure 2E:
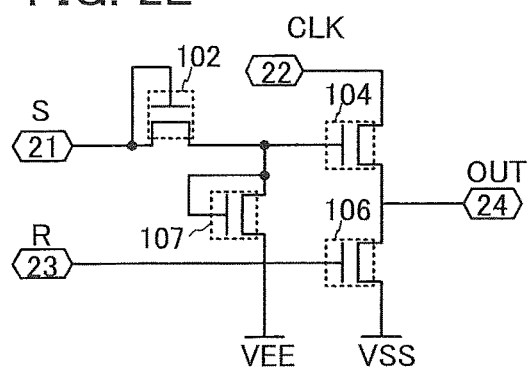
Figure 2F:
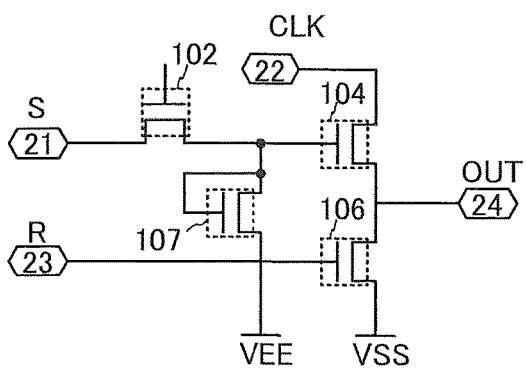

In the structures illustrated in FIGS. 2E and 2F, a first terminal of the switching element 107 is electrically connected to a gate electrode of the switching element 107. That is, the switching element 107 is a diode-connected transistor. The second low power supply potential VEE is supplied as a pulse, for example, whereby the switching element 107 is turned on or off. A potential which is supplied as the pulse is not limited to the second low power supply potential VEE. For example, a first low power supply potential VSS, a first high power supply potential VDD, or a second high power supply potential VCC may be used. In particular, to turn off the switching element 107, a high potential such as the first high power supply potential VDD or the second high power supply potential VCC is preferably applied to the switching element 107. In particular, to turn on the switching element 107, a low potential such as the first low power supply potential VSS or the second low power supply potential VEE is preferably applied to the switching element 107.

Note that the clock signal CLK is a signal which alternates a high level (hereinafter, an H level) and a low level (hereinafter, an L level) at regular intervals.

When the clock signal CLK is at an H level, the first high power supply potential VDD is applied to the second input terminal 22 to which the clock signal CLK is input. When the clock signal CLK is at an L level, the first low power supply potential VSS is applied to the second input terminal 22 to which the clock signal CLK is input.

Accordingly, H-level and L-level potentials are alternately supplied to the transistor 104 which is electrically connected to the second input terminal 22 at regular intervals. Since the clock signal CLK is supplied to the transistor 104 for a long time, a load on the transistor 104 is larger than that on the other transistors. For example, when a first terminal of the transistor 104, which is electrically connected to the second input terminal 22, is a drain electrode, an H level of the clock signal, that is, the first high power supply potential VDD is intermittently applied to the drain electrode. This might result in negative shift of the threshold voltage of the transistor 104.

On the other hand, the pulse signal output circuit illustrated in FIG. 1B uses the second low power supply potential VEE which is lower than the first low power supply potential VSS. Thus, a stable pulse signal can be output even when the threshold voltage of the transistor 104 shifts in the negative direction. For example, the second low power supply potential VEE can be lower than an L-level potential.

In the pulse signal output circuit illustrated in FIG. 1B, when the transistor 102 is in an off state, the second low power supply potential VEE, which is lower than the first low power supply potential VSS, is applied to a gate electrode of the transistor 104 through the switching element 107, and a second terminal of the third transistor 106 is connected to a signal line to which the first low power supply potential VSS is applied.

The pulse signal output circuit illustrated in FIG. 1B includes the first input terminal 21 to which a start pulse signal is input, the second input terminal 22 to which a clock signal is input, the third input terminal 23 to which a reset signal is input, the first output terminal 24 from which a pulse signal is output, the transistor 102, the transistor 104, and the transistor 106. The first terminal of the transistor 102 is electrically connected to the first input terminal 21. A second terminal of the transistor 102 is electrically connected to the gate electrode of the transistor 104. The gate electrode of the transistor 102 is electrically connected to the first terminal of the transistor 102. The first terminal of the transistor 104 is electrically connected to the second input terminal 22. A second terminal of the transistor 104 is electrically connected to a first terminal of the transistor 106 and the first output terminal 24. The second terminal of the transistor 106 is electrically connected to a wiring to which the first low power supply potential VSS is applied. A gate electrode of the transistor 106 is electrically connected to the third input terminal 23. The first low power supply potential VSS and the first high power supply potential VDD are applied to the gate electrode of the transistor 102 by a start pulse signal. While the first low power supply potential VSS is applied to the gate electrode of the transistor 102, the second low power supply potential VEE, which is lower than the first low power supply potential VSS, is applied to the gate electrode of the transistor 104.

Figure 3A:
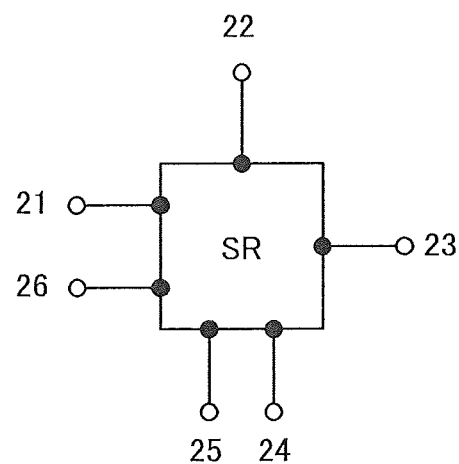
FIGS. 3A and 3B illustrate a pulse signal output circuit of one embodiment of the present invention and a shift register.

The pulse signal output circuits illustrated in FIGS. 1A to 1C and FIGS. 2A to 2F may have a structure of a pulse signal output circuit illustrated in FIG. 3A, for example.

The pulse signal output circuit illustrated in FIG. 3A includes the first input terminal 21, the second input terminal 22, the third input terminal 23, the first output terminal 24, a second output terminal 25, and a fourth input terminal 26.

For example, in the pulse signal output circuit illustrated in FIG. 3A, the start pulse signal SP is input to the first input terminal 21, a first clock signal CLK1 is input to the second input terminal 22, a reset signal is input to the third input terminal 23, a signal which is input to another wiring or a pulse signal output circuit in the next stage is output from the first output terminal 24, a signal which is input to the pulse signal output circuit in the next stage is output from the second output terminal 25, and an inverted start pulse signal (SPB) is input to the fourth input terminal 26.

That is, the pulse signal output circuit illustrated in FIG. 3A has a structure where the second output terminal 25 and the fourth input terminal 26 are added to the pulse signal output circuit illustrated in FIG. 1A.

Figure 3B:
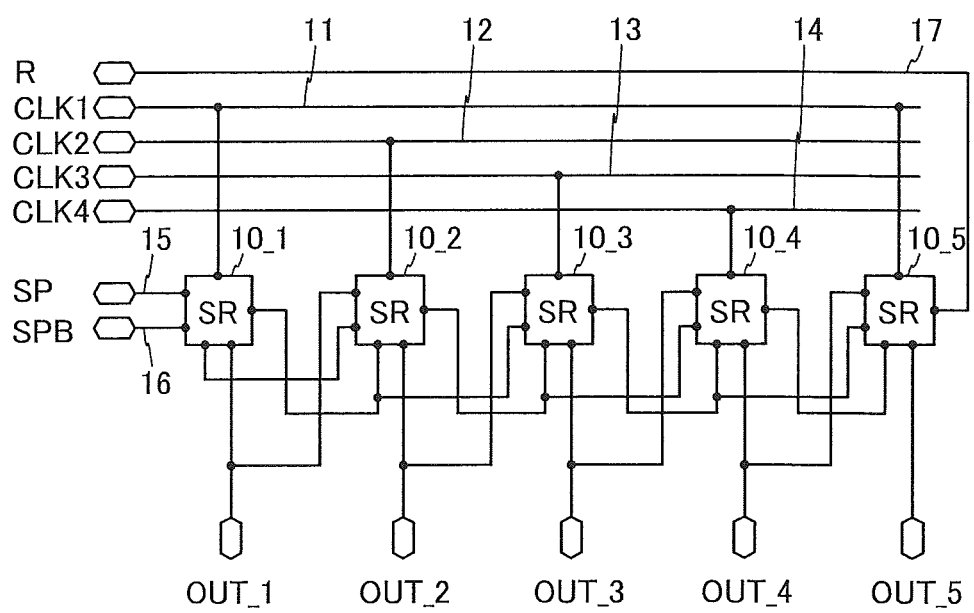

FIG. 3B illustrates an example of a shift register including a plurality of pulse signal output circuits illustrated in FIG. 3A.

The shift register illustrated in FIG. 3B includes a first pulse signal output circuit 10_1, a second pulse signal output circuit 10_2, a third pulse signal output circuit 10_3, a fourth pulse signal output circuit 10_4, and a fifth pulse signal output circuit 10_5.

The first clock signal CLK1 is input to the first pulse signal output circuit 10_1 from a wiring 11. A second clock signal CLK2 is input to the second pulse signal output circuit 10_2 from a wiring 12. A third clock signal CLK3 is input to the third pulse signal output circuit 10_3 from a wiring 13. A fourth clock signal CLK4 is input to the fourth pulse signal output circuit 10_4 from a wiring 14. The first clock signal CLK1 is input to the fifth pulse signal output circuit 10_5 from the wiring 11.

A start pulse signal (SP) is input to the first pulse signal output circuit 10_1 from a wiring 15. An output signal (OUT_1) is input to the second pulse signal output circuit 10_2 from the first pulse signal output circuit 10_1. An output signal (OUT_2) is input to the third pulse signal output circuit 10_3 from the second pulse signal output circuit 10_2. An output signal (OUT_3) is input to the fourth pulse signal output circuit 10_4 from the third pulse signal output circuit 10_3. An output signal (OUT_4) is input to the fifth pulse signal output circuit 10_5 from the fourth pulse signal output circuit 10_4.

An inverted start pulse signal (SPB) is input to the first pulse signal output circuit 10_1 from a wiring 16. An inverted start pulse signal (SPB) is input to the second pulse signal output circuit 10_2 from the first pulse signal output circuit 10_1. An inverted start pulse signal (SPB) is input to the third pulse signal output circuit 10_3 from the second pulse signal output circuit 10_2. An inverted start pulse signal (SPB) is input to the fourth pulse signal output circuit 10_4 from the third pulse signal output circuit 10_3. An inverted start pulse signal (SPB) is input to the fifth pulse signal output circuit 10_5 from the fourth pulse signal output circuit 10_4.

The output signal (OUT_1) is output from the first pulse signal output circuit 10_1. A wiring supplying the output signal (OUT_1) is connected to another wiring or the pulse signal output circuit in the next stage. The output signal (OUT_2) is output from the second pulse signal output circuit 10_2. A wiring supplying the output signal (OUT_2) is connected to another wiring or the pulse signal output circuit in the next stage. The output signal (OUT_3) is output from the third pulse signal output circuit 103. A wiring supplying the output signal (OUT_3) is connected to another wiring or the pulse signal output circuit in the next stage. The output signal (OUT_4) is output from the fourth pulse signal output circuit 10_4. A wiring supplying the output signal (OUT_4) is connected to another wiring or the pulse signal output circuit in the next stage. The output signal (OUT_5) is output from the fifth pulse signal output circuit 10_5. A wiring supplying the output signal (OUT_5) is connected to another wiring.

To the first pulse signal output circuit 10_1, a signal output from the second pulse signal output circuit 10_2 (next stage) is input. To the second pulse signal output circuit 10_2, a signal output from the third pulse signal output circuit 10_3 (next stage) is input. To the third pulse signal output circuit 10_3, signal output from the fourth pulse signal output circuit 10_4 (next stage) is input. To the fourth pulse signal output circuit 10_4, a signal output from the fifth pulse signal output circuit 10_5 (next stage) is input. To the fifth pulse signal output circuit 10_5, a reset signal (R) from a wiring 17 is input.

As described above, the pulse signal output circuit of one embodiment of the present invention can be used for a shift register having a plurality of stages.

An example of a specific circuit structure of the pulse signal output circuit illustrated in FIG. 3A will be described with reference to FIGS. 4A and 4B.

Figure 4A:
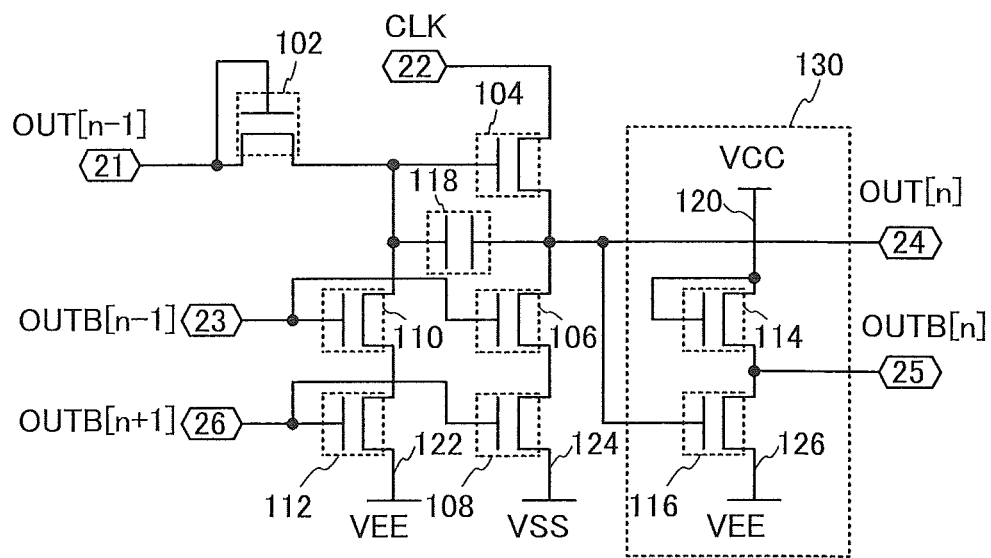
FIGS. 4A and 4B illustrate pulse signal output circuits of one embodiment of the present invention.

A pulse signal output circuit illustrated in FIG. 4A includes the transistor 102, the transistor 104, the transistor 106, a transistor 108, a transistor 110, a transistor 112, a transistor 114, a transistor 116, and a capacitor 118.

The pulse signal output circuit illustrated in FIG. 4A is electrically connected to a wiring 120 to which the second high power supply potential VCC is applied, a wiring 122 to which the second low power supply potential VEE is applied, a wiring 124 to which the first low power supply potential VSS is applied, and a wiring 126 to which the second low power supply potential VEE is applied, in addition to the first input terminal 21, the second input terminal 22, the third input terminal 23, the first output terminal 24, the second output terminal 25, and the fourth input terminal 26 which are illustrated in FIG. 2A.

To the second input terminal 22 to which the clock signal CLK is input, the first high power supply potential VDD is applied when the clock signal CLK is at an H level, and the first low power supply potential VSS is applied when the clock signal CLK is at an L level. Here, the magnitude relationship between the power supply potentials satisfies "the first high power supply potential VDD>the second high power supply potential VCC>the first low power supply potential VSS>the second low power supply potential VEE".

In the pulse signal output circuit illustrated in FIG. 4A, an output signal (OUT[n−1]) is input to the first input terminal 21 from a pulse signal output circuit in the preceding stage, a clock signal (CLK) is input to the second input terminal 22, an inverted output signal (OUTB[n−1]) is input to the third input terminal 23 from a pulse signal output circuit in the preceding stage, an output signal (OUT[n]) is output from the first output terminal 24, an inverted output signal (OUTB[n]) is output from the second output terminal 25, and an inverted output signal (OUTB[n+1]) is input to the fourth input terminal 26 from the pulse signal output circuit in the next stage. Note that n is a natural number of 2 or more.

The first terminal of the transistor 102 is electrically connected to the first input terminal 21. The second terminal of the transistor 102 is electrically connected to the gate electrode of the transistor 104. The gate electrode of the transistor 102 is electrically connected to the first terminal of the transistor 102. The first terminal of the transistor 104 is electrically connected to the second input terminal 22. The second terminal of the transistor 104 is electrically connected to the first terminal of the transistor 106. The second terminal of the transistor 106 is connected to a first terminal of the transistor 108. The gate electrode of the transistor 106 is electrically connected to the third input terminal 23. A second terminal of the transistor 108 is electrically connected to the wiring 124. A gate electrode of the transistor 108 is electrically connected to the fourth input terminal 26.

A first terminal of the transistor 110 is electrically connected to the second terminal of the transistor 102, the gate electrode of the transistor 104, and one electrode of the capacitor 118. A second terminal of the transistor 110 is connected to a first terminal of the transistor 112. A gate electrode of the transistor 110 is electrically connected to the third input terminal 23 and the gate electrode of the transistor 106. A second terminal of the transistor 112 is electrically connected to the wiring 122. A gate electrode of the transistor 112 is electrically connected to the fourth input terminal 26 and the gate electrode of the transistor 108.

A first terminal of the transistor 114 is electrically connected to the wiring 120. A second terminal of the transistor 114 is electrically connected to the first terminal of the transistor 116. A gate electrode of the transistor 114 is electrically connected to the first terminal of the transistor 114. A second terminal of the transistor 116 is electrically connected to the wiring 126. A gate electrode of the transistor 116 is electrically connected to the other electrode of the capacitor 118 and the first output terminal 24. The second terminal of the transistor 114 and the first terminal of the transistor 116 are electrically connected to the second output terminal 25.

Note that each of the transistors is an element having at least three terminals of a gate, a drain, and a source. Each transistor has a channel between the drain and the source, and current can flow through the drain, the channel, and the source. Here, since the source and the drain of the transistor may change depending on the structure, the operating condition, and the like of the transistor, it is difficult to define which is a source or a drain. Thus, in this embodiment, a source and a drain are referred to as a first terminal and a second terminal, in some cases.

Here, the operation of the pulse signal output circuit illustrated in FIG. 4A will be described.

In the pulse signal output circuit illustrated in FIG. 4A, after a start pulse SP is supplied to the first input terminal 21, the clock signal CLK is supplied to the second input terminal 22. That is, an H-level potential and an L-level potential are alternately applied to the first terminal of the transistor 104 which is electrically connected to the second input terminal 22, at regular intervals.

Since the clock signal CLK is supplied to the transistor 104 for a long time, a load on the transistor 104 is larger than that on the other transistors. For example, when a first terminal of the transistor 104 is a drain electrode, an H level of the clock signal, that is, the first high power supply potential (VDD) is intermittently applied to the drain electrode. This might result in negative shift of the threshold voltage of the transistor 104.

On the other hand, while the first low power potential VSS is applied to the first input perminal 21, the pulse signal output circuit illustrated in FIG. 4A uses the second low power supply potential VEE, which is lower than the first low power supply potential VSS, to apply to the gate electrode of the transistor 104 through the transistor 105 and transistor 106. Thus, a stable pulse signal can be output even when the threshold voltage of the transistor 104 shifts in the negative direction. For example, the second low power supply potential VEE can be lower than an L-level potential.

Note that the total potential of the threshold voltage Vth of the transistor 102 and the second low power supply potential VEE is preferably higher than the first low power supply potential VSS. With such a structure, it is possible to prevent shoot-through current which might flow through the wiring 122 when the first low power supply potential VSS is applied to the first input terminal 21.

Figure 4B:
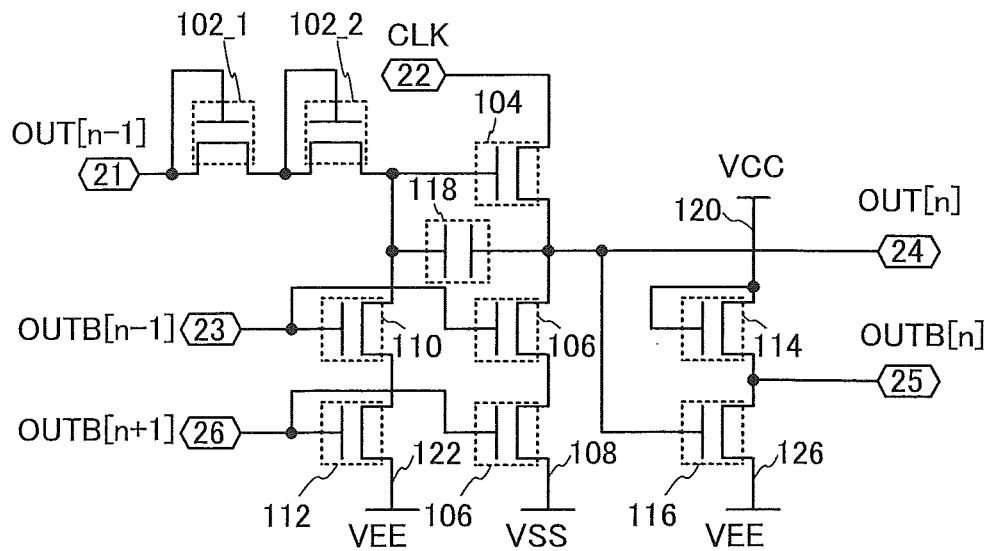

To prevent the shoot-through current, a pulse signal output circuit may have a structure illustrated in FIG. 4B.

A pulse signal output circuit illustrated in FIG. 4B includes two transistors 102 of the pulse signal output circuit illustrated in FIG. 4A. Specifically, the pulse signal output circuit illustrated in FIG. 4B includes a transistor 102_1 and a transistor 1022, instead of the transistor 102.

Note that the total potential of the threshold voltage Vth1 of the transistor 102_1, the threshold voltage Vth2 of the transistor 1022, and the second low power supply potential VEE is preferably higher than the first low power supply potential VSS.

With the transistor 102_1 and the transistor 102_2, a potential corresponding to the total threshold voltage Vth of the two transistors can be higher than the first low power supply potential VSS, whereby shoot-through current which might flow through the wiring 122 can be prevented. Note that the number of the transistors 102 is not limited thereto, and can be three or more, for example.

The W/L of the transistor 116 is preferably larger than the W/L of the transistor 114. Note that L represents the channel length of a transistor, and W represents the channel width of a transistor. This substantially means that the resistance of the transistor 116 is made lower than that of the transistor 114. Thus, a circuit 130 illustrated in FIG. 4A can function as an inverter.

Next, an example of a method for driving the shift register illustrated in FIG. 3B will be described with reference to a timing chart of FIG. 5.

Figure 5:
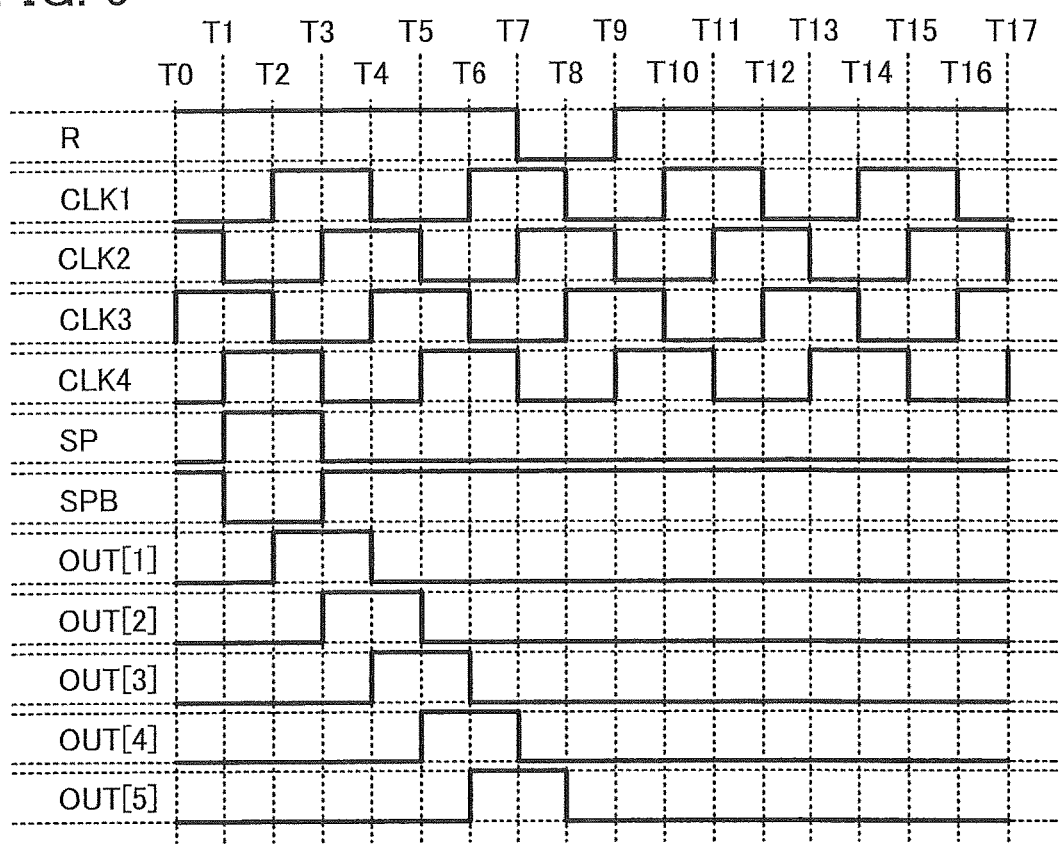
FIG. 5 is a timing chart of a pulse signal output circuit of one embodiment of the present invention.

In the timing chart of FIG. 5 the clock signal CLK2 is delayed from the clock signal CLK1 by ¼ cycle, the clock signal CLK3 is delayed from the clock signal CLK2 by ¼ cycle, and the clock signal CLK4 is delayed from the clock signal CLK3 by ¼ cycle. In addition, the pulse width of the start pulse signal SP is the same as the pulse width of the clock signals CLK1 to CLK4.

The start pulse signal SP is set to an H level in time T1, then the first clock signal (CLK1) is set to an H level in time T2. Further, the first pulse signal output circuit 10_1 to the fifth pulse signal output circuit 10_5 are subsequently output a first output signal OUT[1] to a fifth output signal OUT[5], respectively, in accordance with the first clock signal (CLK1) to a fourth clock signal (CLK4). In time T7, a reset signal R is set to an L level.

The above is the description of the example of the method for driving the shift register illustrated in FIG. 3B.

As described with reference to FIGS. 1A to 1C, FIGS. 2A to 2F, FIGS. 3A and 3B, FIGS. 4A and 4B, and FIG. 5, in an example of the pulse signal output circuit of this embodiment, the second low power supply potential VEE which is lower than the first low power supply potential VSS is used to apply a negative potential to a gate electrode of a transistor. Accordingly, even when the threshold voltage of the transistor shifts in the negative direction, a pulse signal output circuit which stably operates can be obtained.

The structure described in this embodiment can be used in appropriate combination with the structure described in any of the other embodiments.

Embodiment 2

In this embodiment, examples of a display device using the pulse signal output circuit in Embodiment 1 will be described with reference to FIGS. 6A to 6C, FIG. 7, and FIG. 8.

Figure 6A:
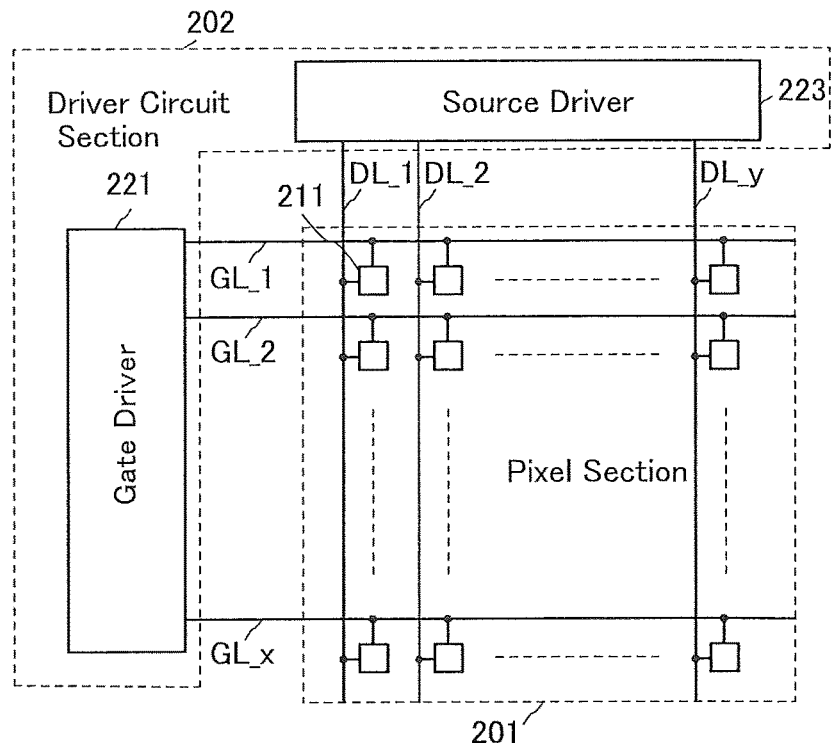
FIGS. 6A to 6C illustrate a display device including a pulse signal output circuit of one embodiment of the present invention.

A display device illustrated in FIG. 6A includes a pixel section 201 and a driver circuit section 202.

The pixel section 201 includes a plurality of pixel circuits 211 arranged in x rows (x is a natural number of 2 or more) and y columns (y is a natural number of 2 or more). The driver circuit section 202 includes driver circuits such as a gate driver 221 and a source driver 223.

The gate driver 221 includes a shift register having a plurality of stages of the pulse signal output circuits in Embodiment 1. For example, the gate driver 221 has a function of controlling potentials of scan lines GL_1 to GL_x in accordance with a pulse signal output from the shift register. Note that a plurality of gate drivers 221 may be provided to separately control the scan lines GL_1 to GL_x.

Image signals are input to the source driver 223. The source driver 223 has a function of generating data signals written in the pixel circuits 211 based on the image signals. The source driver 223 has a function of controlling potentials of data lines DL_1 to DL_y.

The source driver 223 is formed using a plurality of analog switches or the like, for example. The source driver 223 can output signals obtained by time-dividing the image signal as the data signals by sequentially turning on the plurality of analog switches. The source driver 223 may be formed using a shift register or the like. In this case, as the shift register, a shift register including a plurality of stages of the pulse signal output circuits described in Embodiment 1 can be used.

A pulse signal and a data signal are input to one of the plurality of pixel circuits 211 through one of the plurality of scan lines GL and one of the plurality of data lines DL, respectively. Writing and holding of the data signal in each of the plurality of pixel circuits 211 are performed by the gate driver 221. For example, to the pixel circuit 211 in m-th row and n-th column (m is a natural number of less than or equal to x, and n is a natural number of less than or equal to y), a pulse signal is input from the gate driver 221 through the scan line GL_m, and a data signal is input from the source driver 223 through the data line DL_n depending on the potential of the scan line GL_m.

Figure 6B:
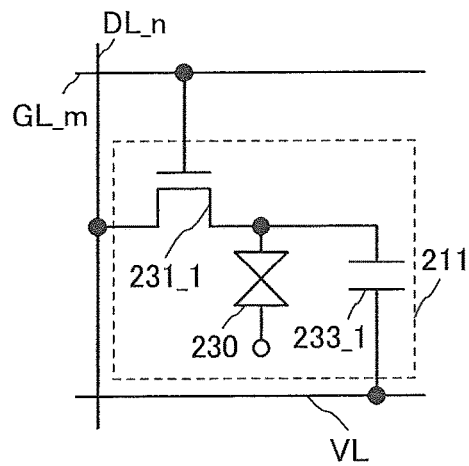

As illustrated in FIG. 6B, the plurality of pixel circuits 211 each includes a liquid crystal element 230, a transistor 231_1, and a capacitor 233_1, for example.

The potential of one of a pair of electrodes of the liquid crystal element 230 is set according to the specifications of the pixel circuit 211 as appropriate. The alignment state of the liquid crystal element 230 depends on written data. A common potential may be applied to one of the pair of electrodes of the liquid crystal element 230 included in each of the plurality of pixel circuits 211. Alternatively, different potentials may be applied to one of the pair of electrodes of the liquid crystal elements 230 included in the pixel circuits 211 on row-by-row basis.

As a display mode of the display device including a liquid crystal element, any of the following modes can be used, for example: a TN (twisted nematic) mode, an IPS (in-plane-switching) mode, an STN (super twisted nematic) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an FFS (fringe field switching) mode, a TBA (transverse bend alignment) mode, and the like.

The liquid crystal element may be formed using a liquid crystal composition including a liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit 211 in the m-th row and the n-th column, a first terminal of the transistor 231_1 is electrically connected to the data line DL_n, and a second terminal of the transistor 231_1 is electrically connected to the other of the pair of electrodes of the liquid crystal element 230. A gate of the transistor 231_1 is electrically connected to the scan line GL_m. The transistor 231_1 has a function of controlling whether to write a data signal by being turned on or off.

One of a pair of electrodes of the capacitor 233_1 is electrically connected to a potential supply line VL, and the other of the pair of electrodes of the capacitor 233_1 is electrically connected to the other of the pair of electrodes of the liquid crystal element 230. The potential of the potential supply line VL is set according to the specifications of the pixel circuit 211 as appropriate. The capacitor 233_1 has a function as a storage capacitor for retaining written data.

In the display device including the pixel circuit 211 illustrated in FIG. 6B, the pixel circuits 211 are sequentially selected row by row by the gate driver 221, whereby the transistors 231_1 are turned on and a data signal is written.

When the transistors 231_1 are turned off, the pixel circuits 211 in which the data has been written are brought into a holding state. This operation is sequentially performed row by row; thus, an image is displayed.

Figure 6C:
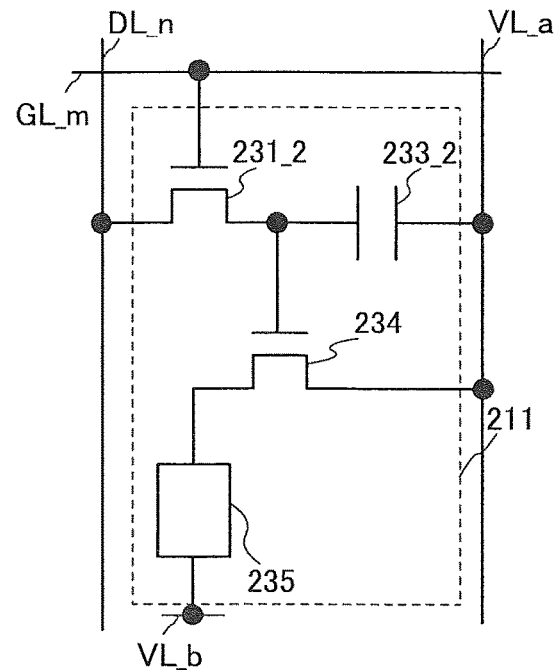

The pixel circuit 211 illustrated in FIG. 6C includes a transistor 231_2, a capacitor 233_2, a transistor 234, and a light-emitting element 235.

A first terminal of the transistor 231_2 is electrically connected to the data line DL_n. A gate of the transistor 231_2 is electrically connected the scan line GL_m.

The transistor 231_2 has a function of controlling whether to write a data signal by being turned on or off.

One of a pair of electrodes of the capacitor 233_2 is electrically connected to a power supply line VL_a, and the other of the pair of electrodes of the capacitor 233_2 is electrically connected to a second terminal of the transistor 231_2.

The capacitor 233_2 has a function as a storage capacitor for retaining written data.

A first terminal of the transistor 234 is electrically connected to the power supply line VL_a. Further, a gate of the transistor 234 is electrically connected to the second terminal of the transistor 2312.

One of an anode and a cathode of the light-emitting element 235 is electrically connected to a power supply line VL_b, and the other of the anode and the cathode of the light-emitting element 235 is electrically connected to a second terminal of the transistor 234.

The light-emitting element 235 may be an organic electroluminescent element (also referred to as organic EL element) or the like, for example. Note that the light-emitting element 235 is not limited thereto and may be an inorganic EL element containing an inorganic material.

The first high power supply potential VDD is applied to one of the power supply line VL_a and the power supply line VL_b, and the first low power supply potential VSS is applied to the other of the power supply line VL_a and the power supply line VL_b.

In the display device including the pixel circuit 211 illustrated in FIG. 6C, the pixel circuits 211 are sequentially selected row by row by the gate driver 221, whereby the transistors 231_2 are turned on and a data signal is written.

When the transistors 231_2 are turned off, the pixel circuits 211 in which the data has been written are brought into a holding state. Further, the amount of current flowing between the source and the drain of the transistor 234 is controlled depending on the potential of the written data signal. The light-emitting element 235 emits light with a luminance corresponding to the amount of flowing current. This operation is sequentially performed row by row; thus, an image is displayed.

An example of a method for driving the display device illustrated in FIG. 6A in the case where the display device can be operated in a low power consumption mode will be described with reference to a timing chart of FIG. 7. Here, a case of using the shift register described in Embodiment 1 as the gate driver 221 is described as an example.

The display device illustrated in FIG. 6A is operated in a normal mode or a low power consumption mode.

The operation in the normal mode is described. In the normal mode, when a start pulse signal SP, a power supply voltage PWR, and clock signals CLK1 to CLK4 are input to the shift register as shown in a period 311 in FIG. 7, the shift register sequentially outputs pulses of output signals OUT_1 to OUT_n in accordance with a pulse of the start pulse signal SP. Note that the power supply voltage PWR is a power supply voltage consisting of the first high power supply potential VDD and the first low power supply potential VSS or a power supply voltage consisting of the second high power supply potential VCC, the first low power supply potential VSS, and the second low power supply potential VEE.

Next, the operation for changing from the normal mode to the low power consumption mode is described. In this case, as shown in a period 312 in FIG. 7, the input of the power supply voltage PWR, the clock signals CLK1 to CLK4, and the start pulse signal SP to the shift register is stopped.

In this case, it is preferable to stop the input of the start pulse signal SP to the shift register at first, then stop the input of the clock signals CLK1 to CLK4 sequentially, and stop the input of the power supply voltage PWR. Thus, a malfunction of the shift register can be prevented.

When the input of the power supply voltage PWR, the clock signals CLK1 to CLK4, and the start pulse signal SP to the shift register is stopped, the output of the pulses of the output signals OUT_1 to OUT_n is stopped. Thus, the display changes to the low power consumption mode.

Figure 7:
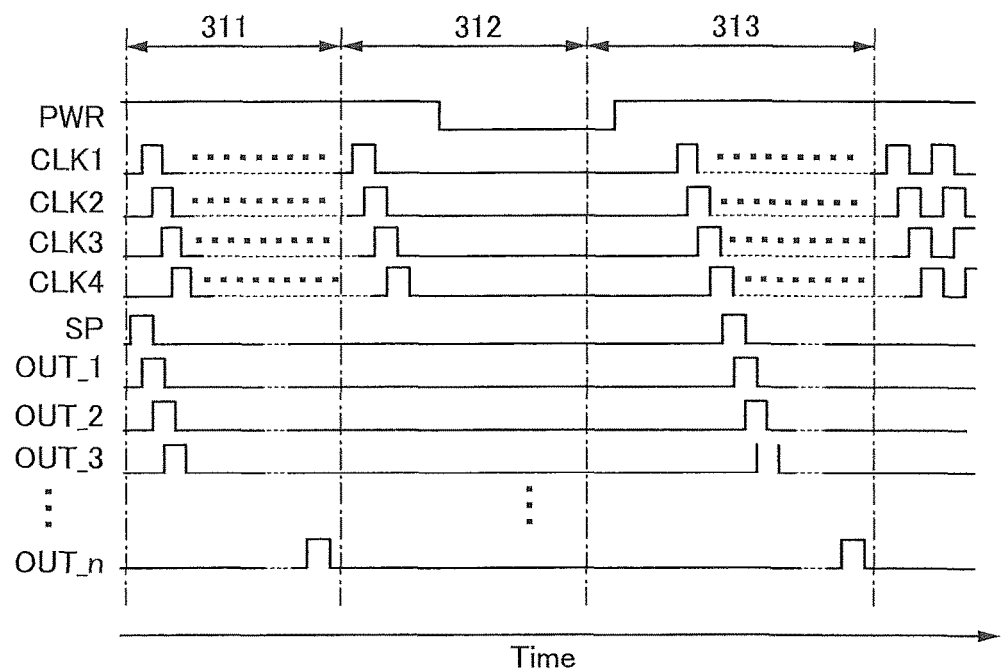
FIG. 7 is a timing chart of a display device including a pulse signal output circuit of one embodiment of the present invention.

To change the shift register back to the normal mode, as shown in a period 313 in FIG. 7, the input of the start pulse signal SP, the clock signals CLK1 to CLK4, and the power supply voltage PWR to the shift register is restarted.

In this period, the input of the power supply voltage PWR to the shift register is restarted first; next, the input of the clock signals CLK1 to CLK4 is restarted; and then the input of the start pulse signal SP is restarted. Moreover, in this case, it is preferable to restart inputting the clock signals CLK1 to CLK4 sequentially after the potentials of the wirings through which the clock signals CLK1 to CLK4 are input are set to the first high power supply potential VDD.

When the input of the start pulse signal SP, the clock signals CLK1 to CLK4, and the power supply voltage PWR to the shift register is restarted, the shift register sequentially outputs pulses of the output signals OUT_1 to OUT_n in accordance with a pulse of the start pulse signal SP. Thus, the display device changes back to the normal mode.

The above is description of an example of the display device in this embodiment.

As described with reference to FIG. 7, in an example of the display device of this embodiment, the operation of a driver circuit including a shift register can be stopped as necessary. Therefore, for example, in displaying images by using pixel circuits including transistors with low off-state current, in the case where rewriting of data signals is not necessary in part or the whole, the operation of a driver circuit can be stopped to increase the rewriting interval. Accordingly, power consumption can be reduced.

Figure 8:
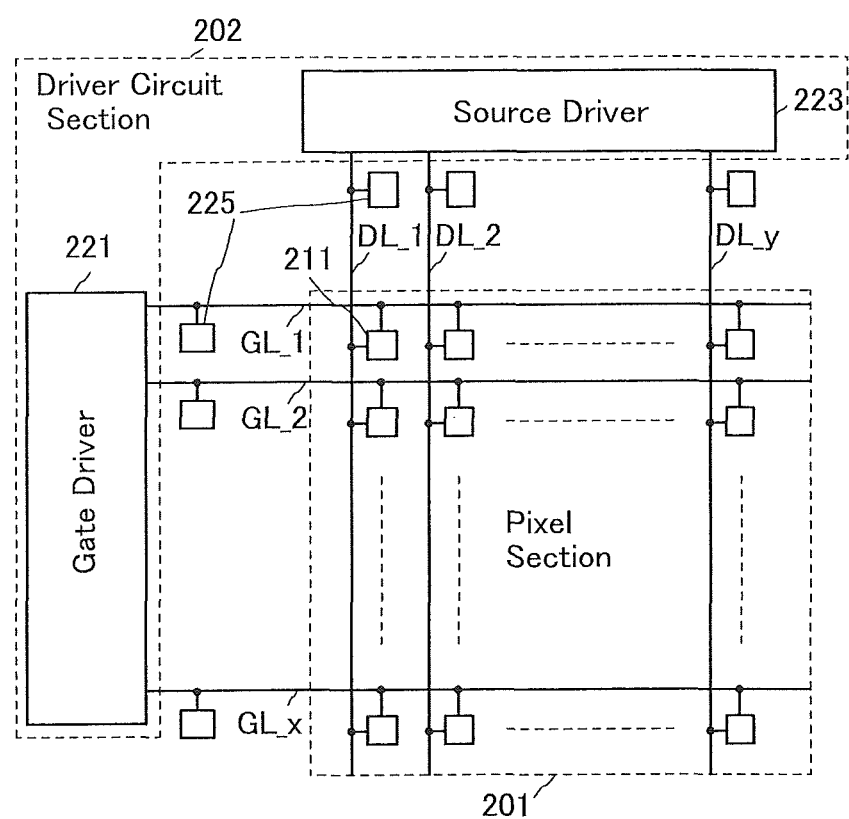
FIG. 8 illustrates a display device including a pulse signal output circuit of one embodiment of the present invention.

As illustrated in FIG. 8, a protection circuit 225 may be connected between the gate driver 221 and the pixel circuit 211 (to the scan line GL). Further, another protection circuit 225 may be connected between the source driver 223 and the pixel circuit 211 (to the data line DL). Each of the protection circuits 225 is a circuit which electrically connects another power supply line to a wiring to which the protection circuit itself is connected when a potential out of a certain range is applied to the wiring. The protection circuits 225 include a diode or the like, for example.

By providing protection circuits as illustrated in FIG. 8, tolerance to overvoltage generated by electro static discharge (ESD) or the like can be increased in the display device.

As described above, in an example of the display device of this embodiment, driver circuits such as the gate driver and the source driver can be formed using the pulse signal output circuit described in Embodiment 1. In these driver circuits, since stable pulses are supplied from a pulse signal output circuit, the display device can have high reliability.

Embodiment 3

In this embodiment, examples of a structure of a display device including the pulse signal output circuit of Embodiment 1 will be described with reference to FIGS. 9A and 9B.

First, the display device illustrated in FIG. 9A will be described below.

Figure 9A:
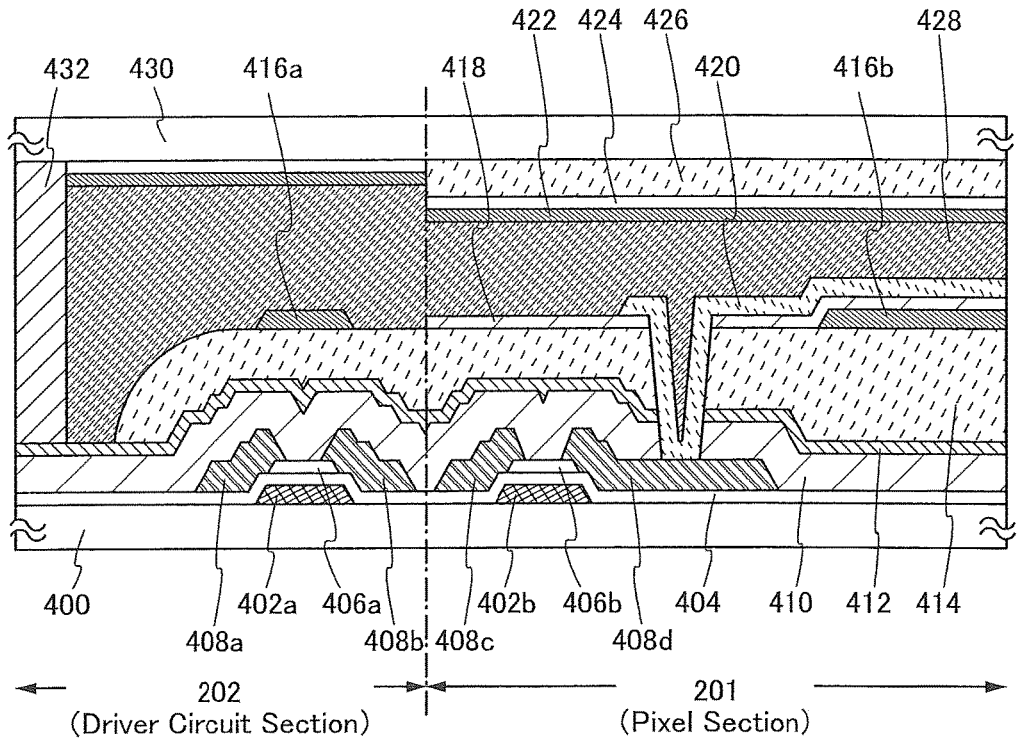
FIGS. 9A and 9B each illustrate a display device including a pulse signal output circuit of one embodiment of the present invention.

The display device illustrated in FIG. 9A includes the pixel section 201 and the driver circuit section 202, which are in the display device illustrated in FIG. 6A. FIG. 9A shows a liquid crystal display device using a vertical electric field mode.

In the display device described in this embodiment, a liquid crystal element is sandwiched between a pair of substrates (a substrate 400 and a substrate 430).

Conductive layers 402a and 402b are formed over the substrate 400. The conductive layer 402a is formed in the driver circuit section 202 and has a function as a gate of a transistor in a driver circuit. The conductive layer 402b is formed in the pixel section 201 and has a function as a gate of a transistor in a pixel circuit.

An insulating layer 404 is formed over the substrate 400, the conductive layer 402a, and the conductive layer 402b. The insulating layer 404 has functions as a gate insulating layer of the transistor in the driver circuit and a gate insulating layer of the transistor in the pixel circuit.

Semiconductor layers 406a and 406b are formed over the insulating layer 404. The semiconductor layer 406a is formed to overlap with the conductive layer 402a and has a function as a channel of the transistor in the driver circuit. The semiconductor layer 406b is formed to overlap with the conductive layer 402b and has a function as a channel of the transistor in the pixel circuit.

Conductive layers 408a, 408b, 408c, and 408d are formed over the insulating layer 404, the semiconductor layer 406a, and the semiconductor layer 406b. The conductive layer 408a is electrically connected to the semiconductor layer 406a and has a function as a first terminal of the transistor in the driver circuit. The conductive layer 408b is electrically connected to the semiconductor layer 406a and has a function as a second terminal of the transistor in the driver circuit. The conductive layer 408c is electrically connected to the semiconductor layer 406b and has a function as a first terminal of the transistor in the pixel circuit. The conductive layer 402d is electrically connected to the semiconductor layer 406b and has a function as a second terminal of the transistor in the pixel circuit.

An insulating layer 410 is formed over the insulating layer 404, the semiconductor layer 406a, the semiconductor layer 406b, the conductive layer 408a, the conductive layer 408b, the conductive layer 408c, and the conductive layer 408d. The insulating layer 410 has a function of protecting the transistors, in particular, the semiconductor layers 406a and 406b.

An insulating layer 412 is formed over the insulating layer 410. The insulating layer 412 has a function of protecting the transistors.

An insulating layer 414 is formed over the insulating layer 412. The insulating layer 414 has a function as a planarization layer. Forming the insulating layer 414 enables prevention of parasitic capacitance between conductive layers below and above the insulating layer 414.

Conductive layers 416a and 416b are formed over the insulating layer 414. The conductive layer 416a overlaps with the semiconductor layer 406a with the insulating layers 410, 412, and 414 laid therebetween and has a function as a back gate of the transistor in the driver circuit. For example, in the case of an n-channel transistor, application of a negative potential to the back gate enables the threshold voltage of the transistor to shift in the positive direction. Note that a ground potential (also referred to as GND) may be applied to the conductive layer 416a or it is also possible not to provide the conductive layer 416a. The conductive layer 416b has a function as one of a pair of electrodes of a capacitor in the pixel circuit.

An insulating layer 418 is formed over the insulating layer 414, the conductive layer 416a, and the conductive layer 416b. The insulating layer 418 has functions as a protective insulating layer of the transistors and a dielectric layer of the capacitor in the pixel circuit. Note that it is preferable that the insulating layer 418 be not formed over the driver circuit section 202 as illustrated in FIG. 9A. With the structure where the insulating layer 418 is not formed over the driver circuit section 202, moisture, impurities, or the like contained in the insulating layer 414 can be released to the outside.

A conductive layer 420 is formed over the insulating layer 418. The conductive layer 420 is electrically connected to the conductive layer 408d through an opening penetrating the insulating layers 410, 412, 414, and 418, and overlaps with the conductive layer 416b with the insulating layer 418 laid therebetween. Further, the conductive layer 420 has functions as one of a pair of electrodes of the liquid crystal element in the pixel circuit and the other of the pair of electrodes of the capacitor.

A coloring layer 426 is formed over the substrate 430. The coloring layer 426 has a function as a color filter. Although not illustrated in FIGS. 9A and 9B, a light-blocking film having a function as a black matrix can be formed adjacent to the coloring layer 426.

An insulating layer 424 is formed over the coloring layer 426. The insulating layer 424 has a function as a planarization layer or a function of preventing impurities contained in the coloring layer 426 from being diffused into the liquid crystal element.

A conductive layer 422 is formed over the insulating layer 424. The conductive layer 422 has a function as the other of the pair of electrodes of the liquid crystal element in the pixel circuit. Note that an insulating film having a function as an alignment film may be additionally formed over the conductive layer 422 and the conductive layer 420.

A liquid crystal layer 428 is formed between the conductive layer 420 and the conductive layer 422. The liquid crystal layer 428 is sealed between the substrate 400 and the substrate 430 with a sealing material 432. The sealing material 432 is preferably in contact with an inorganic material to prevent entrance of moisture or the like from the outside. In this embodiment, the sealing material 432 is in contact with the insulating layer 412 and the substrate 430, for example.

Next, a display device illustrated in FIG. 9B will be described below.

Figure 9B:
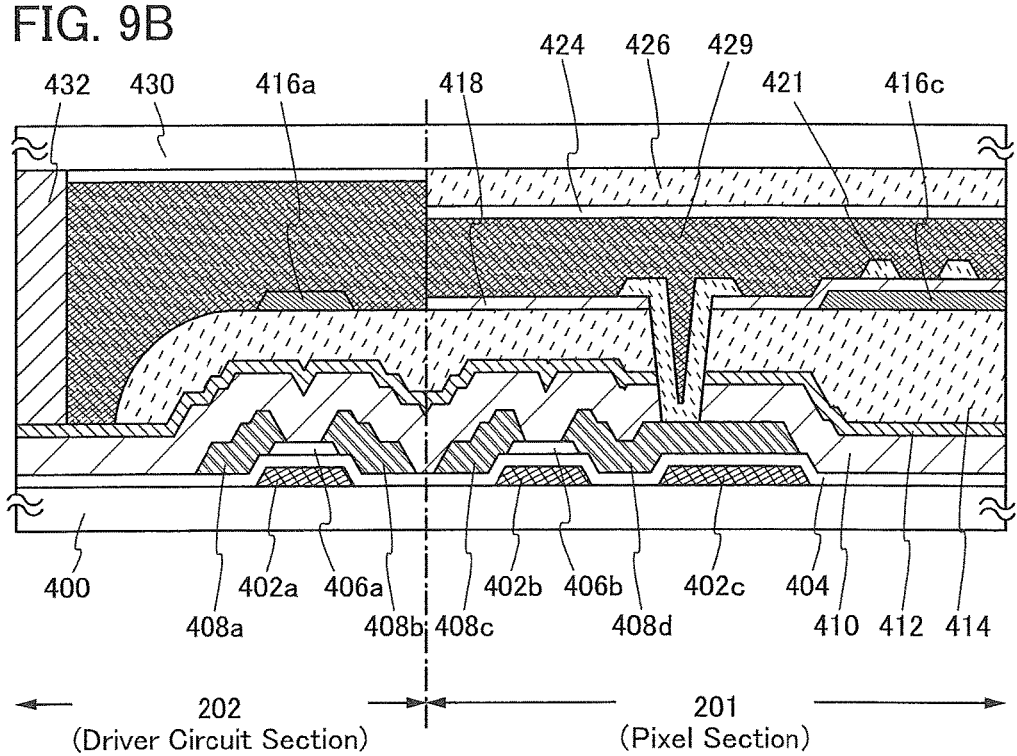

The display device illustrated in FIG. 9B is a display device using a horizontal electric field mode (FFS mode). Unlike the display device illustrated in FIG. 9A, the display device illustrated in FIG. 9B additionally includes a conductive layer 402c, a conductive layer 416c instead of the conductive layer 416b, a conductive layer 421 instead of the conductive layer 420, and a liquid crystal layer 429 instead of the liquid crystal layer 428, and does not have the conductive layer 422. As for the same portions as those of the display device illustrated in FIG. 9A, the display device illustrated in FIG. 9A is referred to.

The conductive layer 402c is formed over the substrate 400 through the same step as the conductive layer 402a and overlaps with the conductive layer 402b and with the conductive layer 408d with the insulating layer 404 laid therebetween. A capacitor can be formed by using the conductive layer 402c, part of the insulating layer 404, and part of the conductive layer 408d. The conductive layer 402c has a function as one of the pair of electrodes of the capacitor, the part of the insulating layer 404 has a function as a dielectric, and the part of the conductive layer 408d has a function as the other of the pair of electrodes of the capacitor.

The conductive layer 416c is formed over the insulating layer 414. The conductive layer 416c has functions as the one of the pair of electrodes of the liquid crystal element in the pixel circuit and the one of the pair of electrodes of the capacitor in the pixel circuit.

The conductive layer 421 is formed over the insulating layer 418 and is electrically connected to the conductive layer 408d through an opening penetrating the insulating layers 410, 412, 414, and 418. The conductive layer 421 has a comb-shaped portion. Each of teeth of the comb-shaped portion overlaps with the conductive layer 416c with the insulating layer 418 laid therebetween. The conductive layer 421 has functions as the other of the pair of electrodes of the liquid crystal element in the pixel circuit and the other of the pair of electrodes of the capacitor in the pixel circuit.

The liquid crystal layer 429 is formed between the conductive layer 421 and the insulating layer 424 and is sealed with the sealing material 432.

In this embodiment, the transistor is a bottom-gate transistor; however, the transistor is not limited thereto and may be a top-gate transistor, for example. In this embodiment, the bottom-gate transistor is what is called, a channel-etch type transistor where a channel is not protected, for example. However, the bottom-gate transistor is not limited thereto and may be what is called, a channel protection transistor where an insulating film is formed to protect the channel, for example.

Next, components of the display devices illustrated in FIGS. 9A and 9B will be described below in detail.

As each of the substrates 400 and 430, a glass substrate of aluminosilicate glass, aluminoborosilicate glass, or barium borosilicate glass, or a plastic substrate can be used, for example. In the mass production, for the substrates 400 and 430, a mother glass with any of the following sizes is preferably used: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time drastically shrink the mother glass. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

A base insulating layer may be provided between the substrate 400 and the conductive layers 402a, 402b, and 402c. As the base insulating layer, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating layer, it is possible to suppress entry of impurities such as an alkali metal, water, and hydrogen from the substrate 400 into the semiconductor layers 406a and 406b.

For the conductive layers 402a, 402b, and 402c, a metal element selected from the group of aluminum, chromium, copper, tantalum, titanium, molybdenum, and tungsten, an alloy containing any of these metal elements as a component, an alloy containing these metal elements in combination, or the like can be used. Further, one or more metal elements selected from manganese or zirconium may be used. The conductive layers 402a, 402b, and 402c may have a single-layer structure or a stacked-layer structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, the conductive layers 402a, 402b, and 402c can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As the insulating layer 404, a single layer or a stacked layer of, for example, a silicon oxide film, a silicon oxynitride film, a silicon nitride oxide film, a silicon nitride film, an aluminum oxide film, a hafnium oxide film, a gallium oxide film, a Ga—Zn-based metal oxide film, a silicon nitride film, a silicon nitride oxide film, or the like can be provided. To improve the properties of the interface with the semiconductor layers 406a and 406b, at least a region of the insulating layer 404, which is in contact with the semiconductor layers 406a and 406b, is preferably formed with an oxide insulating film.

Further, by providing an insulating film having a blocking effect against oxygen, hydrogen, water, and the like over the insulating layer 404, it is possible to prevent outward diffusion of oxygen from the semiconductor layers 406a and 406b and entry of hydrogen, water, or the like into the semiconductor layers 406a and 406b from the outside. As the insulating film that can block oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The insulating layer 404 can be formed as a gate insulating film which has few defects and releases less hydrogen and less ammonia, when formed to have a stacked structure in which a silicon nitride film having few defects is used as a first silicon nitride film, a silicon nitride film which releases less hydrogen and less ammonia is provided as a second silicon nitride film over the first silicon nitride film, and an oxide insulating film is provided over the second silicon nitride film. Thus, transfer of hydrogen and nitrogen, which are contained in the insulating layer 404, to the semiconductor layers 406a and 406b can be suppressed.

The use of a silicon nitride film as the insulating layer 404 has the following effect. The silicon nitride film has a higher relative permittivity than a silicon oxide film and needs a larger thickness for an equivalent capacitance. Thus, the physical thickness of the gate insulating film can be increased. This makes it possible to reduce a decrease in withstand voltage of a transistor and furthermore increase the withstand voltage, thereby reducing electrostatic discharge damage to the transistor used in a display device.

Further, in the case where copper is used for the conductive layers 402a, 402b, and 402c and a silicon nitride film is used as the insulating layer 404 in contact with the conductive layers 402a, 402b, and 402c, the number of the ammonia molecules released from the silicon nitride film by heating is preferably reduced as much as possible so that reaction between copper and the ammonia molecules can be suppressed.

The insulating layer 404 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the insulating layer 404 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor layers 406a and 406 preferably include an oxide semiconductor containing at least indium (In) or zinc (Zn). Alternatively, the semiconductor layers 406a and 406 preferably contains both In and Zn. In order to reduce variation in electrical characteristics of the transistor including the oxide semiconductor, the oxide semiconductor preferably contains one or more of stabilizers in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For the above-listed metal oxides, an In—Ga—Zn-based metal oxide, for example, is an oxide whose main components are In, Ga, and Zn, and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and M is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5$ $(ZnO)_n$ (n>0, n is a natural number) may be used.

For example, an In—Ga—Zn-based metal oxide with an atomic ratio where In:Ga:Zn=1:1:1, In:Ga:Zn=2:2:1, or In:Ga:Zn=3:1:2, or an oxide with an atomic ratio close to the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5 may be used. Note that a proportion of each atom in the atomic ratio of the metal oxide varies within a range of ±20% as an error.

However, without limitation to the materials given above, a material with an appropriate composition may be used in accordance with needed semiconductor characteristics and electric characteristics (e.g., field-effect mobility and the threshold voltage). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, high mobility can be obtained relatively easily in the case where an In—Sn—Zn-based metal oxide is used. Also in the case where an In—Ga—Zn-based metal oxide is used, the field-effect mobility can be increased by reducing the defect density in a bulk.

Further, the energy gap of an oxide semiconductor film that can be used as the semiconductor layers 406a and 406b is 2 eV or higher, preferably 2.5 eV or higher, more preferably 3 eV or higher. The off-state current of a transistor can be reduced by using an oxide semiconductor film having a wide energy gap.

Note that the oxide semiconductor film that can be used as the semiconductor layers 406a and 406b is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Here, the structure of an oxide semiconductor film which is used as the semiconductor layers 406a and 406b is described.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is from 80° to 100°, and accordingly includes a case where the angle is from 85° to 95°.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment.

As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally-on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction image of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction image of the nc-OS film, regions with high luminance in a circular (ring) pattern are shown in some cases. Also in a nanobeam electron diffraction image of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the impurities (e.g., hydrogen, water, carbon dioxide, and nitrogen) which exist in the deposition chamber may be reduced. Furthermore, impurities in a deposition gas may be reduced. Specifically, a deposition gas whose dew point is −80° C. or lower, preferably −100° C. or lower is used.

For example, the CAAC-OS film is formed with a polycrystalline oxide semiconductor sputtering target by a sputtering method. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle, for example, reaches the substrate surface, migration occurs on the substrate surface, so that a flat plane of the flat-plate-like sputtered particle, for example, is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

The thickness of the oxide semiconductor film is preferably greater than or equal to 1 nm and less than or equal to 100 nm, more preferably greater than or equal to 1 nm and less than or equal to 30 nm, still more preferably greater than or equal to 1 nm and less than or equal to 50 nm, further preferably greater than or equal to 3 nm and less than or equal to 20 nm.

In the oxide semiconductor film used as the semiconductor layers 406a and 406b, the concentration of an alkali metal or an alkaline earth metal obtained by secondary ion mass spectrometry (SIMS) is preferably lower than or equal to $1\times10^{18}$ atoms/cm$^3$, more preferably lower than or equal to $2\times10^{16}$ atoms/cm$^3$. This is because an alkali metal and an alkaline earth metal are bonded to an oxide semiconductor and generate carriers in some cases and cause an increase in off-state current of the transistor.

Further, the hydrogen concentration in the oxide semiconductor film used as the semiconductor layers 406a and 406b, which is measured by secondary ion mass spectrometry, is preferably lower than $5\times10^{18}$ atoms/cm$^3$, more preferably $1\times10^{18}$ atoms/cm$^3$ or lower, still more preferably $5\times10^{17}$ atoms/cm$^3$ or lower, further preferably $1\times10^{16}$ atoms/cm$^3$ or lower.

Hydrogen contained in the oxide semiconductor film reacts with oxygen bonded to a metal atom to produce water, and a defect is formed in a lattice from which oxygen is released (or a portion from which oxygen is removed). In addition, a bond of part of hydrogen and oxygen causes generation of electrons serving as carrier. Thus, the impurities containing hydrogen are reduced as much as possible in the step of forming the oxide semiconductor film, whereby the hydrogen concentration in the oxide semiconductor film can be reduced. Therefore, an oxide semiconductor film in which hydrogen is removed as much as possible is used in a channel formation region, whereby a shift of the threshold voltage in the negative direction can be suppressed and variation in electrical characteristics can be reduced. Further, leakage current between a source and a drain of the transistor, typically off-state current, can be reduced.

In addition, the nitrogen concentration in the oxide semiconductor film used as the semiconductor layers 406a and 406b is set to be lower than or equal to $5\times10^{18}$ atoms/cm$^3$, whereby a shift of the threshold voltage in the negative direction can be suppressed and variation in electrical characteristics can be reduced.

Various experiments can prove low off-state current of a transistor including a highly-purified oxide semiconductor film from which hydrogen is removed as much as possible as a channel formation region. For example, even a transistor with a channel width of $1\times10^6$ μm and a channel length of 10 μm can have an off-state current less than or equal to the measurement limit of a semiconductor parameter analyzer, that is, less than or equal to $1\times10^{-13}$ A when the voltage (drain voltage) between a source electrode and a drain electrode ranges between 1 V and 10 V. In this case, it can be seen that the off-state current corresponding to a value obtained by dividing the off-state current by the channel width of the transistor is 100 zA/μm or lower. In addition, a capacitor and a transistor are connected to each other and the off-state current is measured with a circuit in which charge flowing into or from the capacitor is controlled by the transistor. In the measurement, a purified oxide semiconductor film has been used for a channel formation region of the transistor, and the off-state current of the transistor has been measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Consequently, the transistor including the highly purified oxide semiconductor film as the channel formation region has extremely small off-state current.

The conductive layers 408a, 408b, 408c, and 408d are formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component, as a conductive material. For example, a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given. Note that a transparent conductive material containing indium oxide, tin oxide, or zinc oxide may be used.

In this embodiment, the conductive layers 408a, 408b, 408c, and 408d are provided over the semiconductor layers 406a and 406b; however, the conductive layers 408a, 408b, 408c, and 408d may be provided between the insulating layer 404 and the semiconductor layers 406a and 406b.

As the insulating layer 410, an oxide insulating film is preferably used so as to improve characteristics of the interface with the oxide semiconductor film used for the semiconductor layers 406a and 406b. As the the insulating layer 410, a silicon oxide film, a silicon oxynitride film, an aluminum oxide film, a hafnium oxide film, a gallium oxide film, a Ga—Zn-based metal oxide film, or the like having a thickness greater than or equal to 150 nm and less than or equal to 400 nm can be used.

As the insulating layer 412, a nitride insulating film is preferably used. For example, a silicon nitride oxide film and a silicon oxide film can be given. As a combination of the insulating layer 410 and the insulating layer 412, a stacked-layer structure of a silicon oxynitride film and a silicon nitride oxide film can be used.

For the insulating layer 414, an organic insulating material having heat resistance such as an acrylic-based resin, a polyimide-based resin, a benzocyclobutene-based resin, a polyamide-based resin, or an epoxy-based resin can be used. Note that the insulating layer 414 may be formed by stacking a plurality of insulating films formed using these materials. With the use of the insulating layer 414, the unevenness in the transistor and the like can be reduced.

For the conductive layers 416a, 416b, and 416c, a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, or indium tin oxide to which silicon oxide is added can be used.

For the insulating layer 418, an inorganic insulating material such as a silicon oxide film, a silicon oxynitride film, a silicon nitride oxide film, a silicon nitride film, or an aluminum oxide film can be used.

For the conductive layers 420, 421, and 422, a material similar to a material used for the conductive layers 416a, 416b, and 416c can be used.

For the coloring layer 426, a material having the property of transmitting light in a specific wavelength band may be used, and an organic resin film including a dye or a pigment, or the like can be used.

The insulating layer 424 is provided so that an ionic substance included in the coloring layer 426 is not dispersed into the liquid crystal layers 428 and 429. However, the insulating layer 424 is not necessarily provided, without being limited to that structure.

The liquid crystal layer 428 can be, for example, a layer containing a TN liquid crystal, an STN liquid crystal, an OCB liquid crystal, a VA liquid crystal, an electrically controlled birefringence (ECB) liquid crystal, a guest host (GH) liquid crystal, a polymer dispersed liquid crystal, or a discotic liquid crystal can be used.

The liquid crystal layer 429 can be a layer including liquid crystal exhibiting a blue phase, for example. A layer including liquid crystal exhibiting a blue phase contains a liquid crystal composition including liquid crystal exhibiting a blue phase, a chiral material, a liquid-crystalline monomer, a non-liquid-crystalline monomer, and a polymerization initiator. The liquid crystal exhibiting a blue phase has a short response time, and has optical isotropy that contributes to the exclusion of the alignment process and reduction of viewing angle dependence. Therefore, with the liquid crystal exhibiting a blue phase, the operation speed of the liquid crystal display device can be increased.

As the sealing material 432, a thermosetting resin, an ultraviolet curable resin, or the like can be used.

Although not illustrated in FIGS. 9A and 9B, an optical member (optical substrate) such as a polarizing member, a retardation member, or an anti-reflection member may be provided as appropriate. For example, circular polarization may be obtained by using a polarizing substrate and a retardation substrate. In addition, a backlight, a side light, or the like may be used as a light source. A spacer may be provided to control a distance (cell gap) between the substrate 400 and the substrate 430. Note that the cell gap determines the thickness of the liquid crystal layers 428 and 429. For example, the spacer can have any shape, like a columnar spacer or a spherical spacer formed by selective etching of an insulating film, or the like.

As a display method in the pixel section 201, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that an embodiment of the present invention is not limited to the application to a display device for color display; the disclosed invention can also be applied to a display device for monochrome display.

The above is the description of an example of the structure of the display devices illustrated in FIGS. 9A and 9B.

In examples of the display device of this embodiment, a driver circuit is provided over the same substrate as a pixel circuit as described with reference to FIGS. 9A and 9B. Thus, the number of wirings for connecting the pixel circuit and the driver circuit can be reduced.

Although the variety of films such as the conductive layer, the semiconductor layer, and the insulating layer which are described in the above embodiment can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the conductive layer, the semiconductor layer, and the inorgenic insulating layer which is described in the above embodiments can be formed by a thermal CVD method such as a MOCVD method or an ALD method. For example, in the case where an InGaZnO$_X$ (X>0) film is formed, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of diethyizinc is Zn(CH$_3$)$_2$. Without limitation to the above combination, triethylgallium (chemical formula: (C$_2$H$_5$)$_3$Ga) can be used instead of trimethylgallium and dimethylzinc (chemical formula: (C$_2$H$_5$)$_2$Zn) can be used instead of diethylzinc.

For example, in the case where a hafnium oxide film is formed by a deposition apparatus using an ALD method, two kinds of gases, i.e., ozone (O$_3$) as an oxidizer and a source gas which is obtained by vaporizing a solvent and liquid containing a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed by a deposition apparatus using an ALD method, two kinds of gases, e.g., H$_2$O as an oxidizer and a source gas which is obtained by vaporizing a solvent and liquid containing an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionato).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., O$_2$ or dinitrogen monoxide) are supplied to react with the adsorbate.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, e.g., an InGaZnO film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO layer, an InZnO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Further, instead of an In(CH$_3$)$_3$ gas, an In(C$_2$H$_5$)$_3$ gas may be used. Furthermore, a Zn(CH$_3$)$_2$ gas may be used.

The structure described in this embodiment can be used in appropriate combination with the structure described in any of the other embodiments.

Embodiment 4

In this embodiment, a structure of a transistor which can be used for the pulse signal output circuit of one embodiment of the present invention and the shift register including the pulse signal output circuit will be described with reference to FIGS. 10A and 10B, FIGS. 11A to 11D, and FIGS. 12A to 12C.

Figure 10A:
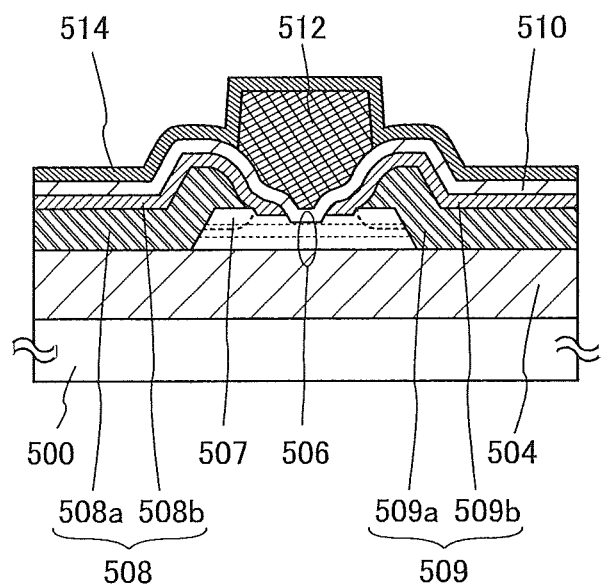
FIGS. 10A and 10B illustrate a cross-sectional structure of an oxide stack of one embodiment of the present invention.

FIG. 10A is a cross-sectional view of a transistor which can be used in one embodiment of the present invention.

A transistor illustrated in FIG. 10A includes a substrate 500; an insulating layer 504 formed over the substrate 500; an oxide stack 506 formed over the insulating layer 504; a source electrode layer 508 and a drain electrode layer 509 which are formed over the insulating layer 504 and the oxide stack 506; a gate insulating layer 510 formed over the oxide stack 506, the source electrode layer 508, and the drain electrode layer 509; and a gate electrode layer 512 formed over the gate insulating layer 510 and overlapping with the oxide stack 506. In the transistor illustrated in FIG. 10A, an insulating layer 514 having a function as a protective insulating film covers the transistor.

The substrate 500 can be formed using any of the materials for the substrate 400 in the above embodiment.

Here, the insulating layer 504 is an insulating film containing oxygen because such insulating film has functions of preventing impurity from being diffused from the substrate 500, and supplying oxygen into the oxide stack 506, in particular, an oxide semiconductor layer 506_2 (FIG. 10B) in the oxide stack 506. In particular, the insulating layer 504 is preferably an insulating film containing excess oxygen. An oxide insulating film containing excess oxygen refers to an oxide insulating film from which oxygen can be released by heat treatment or the like. In other words, the insulating layer 504 is an oxide insulating film which can release oxygen by heating. The insulating layer 504 containing excess oxygen is preferably a film in which the amount of released oxygen when converted into oxygen atoms is $1.0 \times 10^{19}$ atoms/cm$^3$ or more in thermal desorption spectroscopy analysis. Further, excess oxygen refers to oxygen which can be transferred in the oxide semiconductor layer, silicon oxide, or silicon oxynitride by heat treatment, oxygen in excess of an intrinsic stoichiometric composition, or oxygen which can fill Vo (oxygen vacancy) caused by lack of oxygen. Oxygen released from the insulating layer 504 can be diffused to the channel formation region of the oxide stack 506, so that oxygen vacancies which might be formed in the oxide semiconductor layer 506_2 can be filled with the oxygen. In this manner, stable electrical characteristics of the transistor can be achieved.

The gate insulating layer 510 can be formed by referring to a material in description of the insulating layer 404 in the above embodiment. The gate electrode layer 512 can be formed by referring to a material in description of the conductive layers 402a, 402b, and 402c in the above embodiment. The insulating layer 514 can be formed by referring to a material in description of the insulating layer 412 in the above embodiment.

The source electrode layer 508 and the drain electrode layer 509 which are described in this embodiment have a stacked-layer structure of a source electrode layer 508a and a source electrode layer 508b and a stacked-layer structure of a drain electrode layer 509a and a drain electrode layer 509b, respectively.

For the source electrode layer 508a and the drain electrode layer 509a, a conductive material which easily reacts to oxygen can be used. For example, Al, Cr, Cu, Ta, Ti, Mo, or W can be used. It is particularly preferable to use Ti or W having a high melting point because the temperature in a later process can be relatively high. Note that the conductive material which easily reacts to oxygen includes, in its category, a material to which oxygen is easily diffused or transferred.

For the source electrode layer 508b and the drain electrode layer 509b, a conductive material which does not easily react to oxygen is used. As the conductive material, for example, a conductive nitride such as tantalum nitride or titanium nitride, or ruthenium is preferably used. Note that the conductive material which does not easily react to oxygen includes, in its category, a material to which oxygen is not easily diffused or transferred.

In the oxide stack 506, an n-type region 507 is formed in a region being in contact with the source electrode layer 508a and the drain electrode layer 509a.

The n-type region 507 is a part of the oxide stack 506 from which oxygen is extracted to the source electrode layer 508a and the drain electrode layer 509a sides and thus has many oxygen vacancies. In addition, the n-type region 507 may contain a component of the source electrode layer 508a and the drain electrode layer 509a. For example, in the case where a tungsten film is used as the source electrode layer 508a and the drain electrode layer 509a, a tungsten element may be contained in the n-type region 507.

In the case of forming a transistor with an extremely short channel length, the n-type region which is formed by the generation of the oxygen vacancies sometimes extends in the channel length direction of the transistor. In that case, electrical characteristics of the transistor change; for example, the threshold voltage shifts or on and off of the transistor cannot be controlled with the gate voltage (i.e., the transistor is on). Accordingly, when a transistor with an extremely short channel length is formed, it is not preferable that the conductive material which easily reacts to oxygen be used for the source electrode and the drain electrode.

Thus, in this embodiment, the source electrode and the drain electrode have stacked-layer structures, and the source electrode layer 508b and the drain electrode layer 509b, which determine the channel length, are formed using the conductive material which does not easily react to oxygen. By the use of the above conductive material which does not easily react to oxygen for the source electrode layer 508b and the drain electrode layer 509b, generation of oxygen vacancies in the channel formation region of the oxide stack 506 can be suppressed, so that change of the channel into an n-type can be suppressed. In this manner, even a transistor with an extremely short channel length can have favorable electrical characteristics.

The oxide stack 506 illustrated in FIG. 10A will be described in detail below.

Figure 10B:
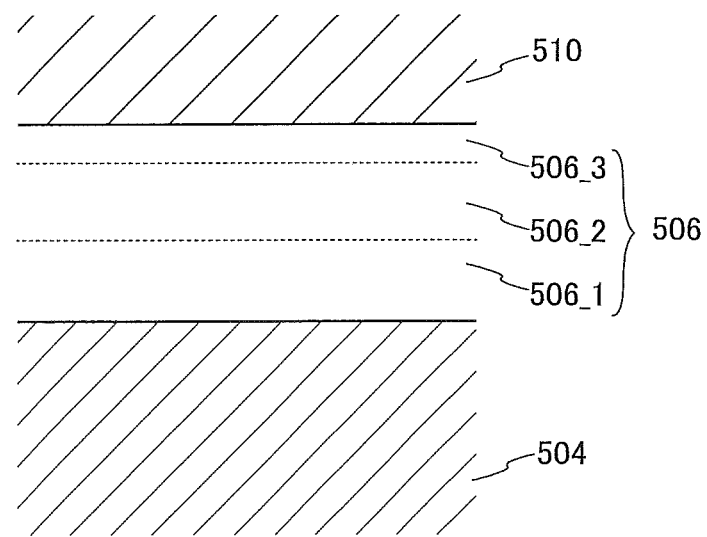

The oxide stack 506 includes, as illustrated in FIG. 10B, a first oxide layer 506_1 formed between the insulating layer 504 and the gate insulating layer 510, the oxide semiconductor layer 506_2 formed over the first oxide layer 506_1, and a second oxide layer 506_3 formed over the oxide semiconductor layer 506_2.

The oxide semiconductor layer 506_2 includes a layer represented by an In-M-Zn oxide, which contains at least indium, zinc, and M (such as Al, Ga, Ge, Y, Zr, Sn, La, Ce, or Hf). The oxide semiconductor layer 506_2 preferably includes indium, because carrier mobility of the transistor is increased. For the oxide semiconductor layer 506_2, a material used for the semiconductor layers 406a and 406b described in the above embodiment can be used.

Each of the first oxide layer 506_1 and the second oxide layer 506_3 is an oxide layer containing one or more kinds of metal elements forming the the oxide semiconductor layer 506_2.

The first oxide layer 506_1 under the oxide semiconductor layer 506_2 includes an oxide layer which is represented by an In-M-Zn oxide (M is a metal such as Al, Ti, Ga, Ge, Y, Zr, Sn, La, Ce, or Hf) and in which the atomic ratio of M to In is higher than that in the oxide semiconductor layer 506_2. Specifically, as the first oxide layer 506_1, an oxide layer containing the above element at proportion 1.5 times or more, preferably twice or more, more preferably 3 times or more than in the oxide semiconductor layer 506_2 is used. Any of the above elements is more strongly bonded to oxygen than indium, and thus has a function of suppressing generation of an oxygen vacancy in the oxide layer. That is, an oxygen vacancy is more unlikely to be generated in first oxide layer 506_1 than in the oxide semiconductor layer 506_2.

The the second oxide layer 506_3 above the oxide semiconductor layer 506_2 includes an oxide layer which is represented by an In-M-Zn oxide (M is a metal such as Al, Ti, Ga, Ge, Y, Zr, Sn, La, Ce, or Hf) and in which the atomic ratio of M to In is higher than that in the oxide semiconductor layer 506_2, like the first oxide layer 506_1. Specifically, as second oxide layer 506_3, an oxide layer containing the above element at proportion 1.5 times or more, preferably twice or more, more preferably 3 times or more that in the oxide semiconductor layer 506_2 is used.

In other words, when each of the first oxide layer 506_1, the oxide semiconductor layer 506_2, and the second oxide layer 506_3 is an In-M-Zn oxide layer containing at least indium, zinc, and M (M is a metal element such as Al, Ti, Ga, Ge, Y, Zr, Sn, La, Ce, or Hf), and the atomic ratio of In to M and Zn included in the first oxide layer 506_1 is $x_1:y_1:z_1$, the atomic ratio of In to M and Zn included in the oxide semiconductor layer 506_2 is $x_2:y_2:z_2$, and the atomic ratio of In to M and Zn included in the second oxide layer 506_3 is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more, more preferably 3 times or more as large as $y_2/x_2$. At this time, when $y_2$ is greater than $x_2$ in the oxide semiconductor layer 506_2, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

When an In—M—Zn oxide is used for first oxide layer 506_1, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. When the oxide semiconductor layer 506_2 is an In-M-Zn oxide layer, preferably in the atomic ratio of In and M, the proportion of In is 25 atomic % or higher and the proportion of M is lower than 75 atomic %, and preferably in the atomic ratio of In and M, the proportion of In is 34 atomic % or higher and the proportion of M is lower than 66 atomic %. When the second oxide layer 506_3 is an In—M—Zn oxide, it is preferable that, in the atomic ratio of In and M, the proportion of In be less than 50 atomic % and the proportion of M be greater than or equal to 50 atomic %, and it is more preferable that, in the atomic ratio of In and M, the concentration of In be less than 25 atomic % and the proportion of M be greater than or equal to 75 atomic %.

The constituent elements of the first oxide layer 506_1 and the second oxide layer 506_3 may be different from each other, or their constituent elements may be the same at the same atomic ratios or different atomic ratios.

For the first oxide layer 506_1, the oxide semiconductor layer 506_2, and the second oxide layer 506_3, for example, an oxide semiconductor containing indium, zinc, and gallium can be used. Specifically, the first oxide layer 506_1 is preferably formed using an In—Ga—Zn oxide whose atomic ratio of In to Ga and Zn is 1:3:2, an In—Ga—Zn oxide whose atomic ratio of In to Ga and Zn which is 1:6:4, an In—Ga—Zn oxide whose atomic ratio of In to Ga and Zn is 1:9:6, or an oxide having a composition is in the neighborhood of any of the above atomic ratios. The oxide semiconductor layer 506_2 can be formed using an In—Ga—Zn oxide containing In, Ga, and Zn at an atomic ratio of 1:1:1, an In—Ga—Zn oxide containing In, Ga, and Zn at an atomic ratio of 3:1:2, or an oxide containing In, Ga, and Zn in the vicinity of the above atomic ratios. The second oxide layer 506_3 is preferably formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios.

The thicknesses of the first oxide layer 506_1 and the second oxide layer 506_3 are greater than or equal to 3 nm and less than or equal to 100 nm, preferably greater than or equal to 3 nm and less than or equal to 50 nm. The thickness of the oxide semiconductor layer 506_2 is greater than or equal to 3 nm and less than or equal to 200 nm, preferably greater than or equal to 3 nm and less than or equal to 100 nm, further preferably greater than or equal to 3 nm and less than or equal to 50 nm.

It is preferable that each of the first oxide layer 506_1 and the second oxide layer 506_3 contain one or more kinds of metal elements forming the oxide semiconductor layer 506_2 and be formed using an oxide layer whose energy of the minimum conduction band is higher than that of the oxide semiconductor layer 506_2 by 0.05 eV or more, 0.07 eV or more, 0.1 eV or more, or 0.15 eV or more and is close to the vacuum level by 2 eV or less, 1 eV or less, 0.5 eV or less, or 0.4 eV or less. That is, it is preferable that each of the first oxide layer 506_1 and the second oxide layer 506_3 contain one or more kinds of metal elements forming the oxide semiconductor layer 506_2 and be formed using an oxide layer whose energy of the minimum conduction band is higher than that of the oxide semiconductor layer 506_2 by more than or equal to 0.05 eV and less than or equal to 2 eV and is close to the vacuum level.

When an electric field is applied to a gate electrode layer (the gate electrode layer 512 in FIGS. 10A and 10B) in such a structure, a channel is formed in the oxide semiconductor layer 506_2 of the oxide stack 506, because the oxide semiconductor layer 506_2 has low energy at the minimum conduction band. In other words, the second oxide layer 506_3 is formed between the oxide semiconductor layer 506_2 and the gate insulating layer 510, whereby a structure in which the channel of the transistor is not in contact with the gate insulating layer 510 can be obtained.

Here, band structures of the case where a silicon oxide film is provided to be in contact with the oxide stack 506 will be described with reference to FIGS. 11A to 11D.

Band structures shown in FIGS. 11A and 11B will be described below.

Figure 11A:
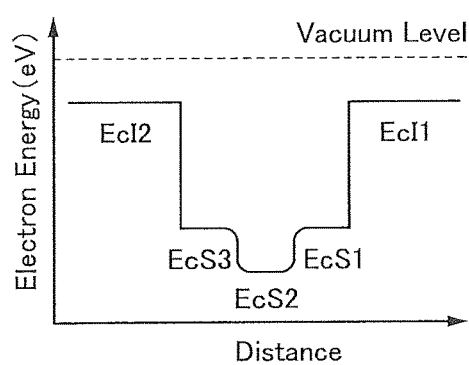
FIGS. 11A to 11D each illustrate a band structure of an oxide stack of one embodiment of the present invention.
Figure 11B:
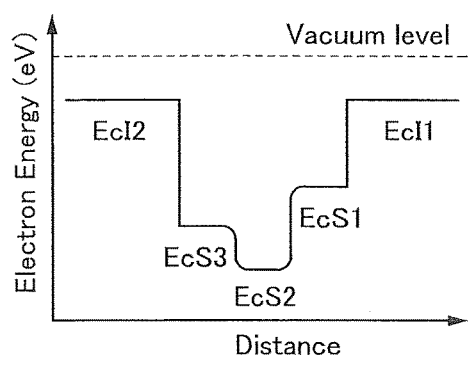

In FIGS. 11A and 11B, the vertical axis represents electron energy (eV) and the horizontal axis represents distance. Here, EcI1 and EcI2 represent energy at the minimum conduction band of the silicon oxide film, EcS1 represents energy at the minimum conduction band of the first oxide layer 506_1, EcS2 represents energy at the minimum conduction band of the oxide semiconductor layer 506_2, and EcS3 represents energy at the minimum conduction band of the second oxide layer 506_3.

As shown in FIG. 11A, the energies of the minimum conduction bands of the first oxide layer 506_1, the oxide semiconductor layer 506_2, and the second oxide layer 506_3 are changed continuously. This can be understood also from the fact that the compositions of the first oxide layer 506_1, the oxide semiconductor layer 506_2, and the second oxide layer 506_3 are close to each other and oxygen is easily diffused.

Note that although the case where the first oxide layer 506_1 and the second oxide layer 506_3 are oxide layers having the same energy gap is shown in FIG. 11A, the first oxide layer and the second oxide layer may be oxide layers having different energy gaps. For example, FIG. 11B shows part of the band structure in which EcS1 is higher than EcS3. Alternatively, EcS3 may be higher than EcS1.

According to FIGS. 11A and 11B, in the transistor including the oxide stack 506, a channel is formed in the oxide semiconductor layer which serves as a well. Note that since the energies of the minimum conduction bands are changed continuously, the oxide stack 506 can also be said to have a U-shaped well. Further, a channel formed to have such a structure can also be referred to as a buried channel.

Since each of the first oxide layer 506_1 and the second oxide layer 506_3 is an oxide layer containing one or more kinds of metal elements forming the oxide semiconductor layer 506_2, the oxide stack 506 can also be referred to as an oxide stack in which layers containing the same main components are stacked. The oxide stack in which layers containing the same main components are stacked is formed to have a continuous energy band (here, in particular, a well structure having a U shape in which energies of the minimum conduction bands are changed continuously between any two of the layers). This is because when an impurity which forms a defect level such as a trapping center or a recombination center is mixed at an interface between the layers, the continuity of the energy band is lost, and thus carriers are trapped or disappear by recombination at the interface.

In order to form continuous junction, the layers need to be stacked successively without being exposed to the air by using a multi-chamber deposition system (sputtering system) provided with a load lock chamber. Each chamber of the sputtering system is preferably evacuated to a high vacuum (to about $1 \times 10^{-4}$ Pa to $5 \times 10^{-7}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

Not only high vacuum evaporation in a chamber but also high purity of a sputtering gas is necessary to obtain a high-purity intrinsic oxide semiconductor. When a highly purified gas having a dew point of −40° C. or lower, preferably −80° C. or lower, more preferably −100° C. or lower is used as an oxygen gas or an argon gas used as a sputtering gas, moisture or the like can be prevented from entering an oxide semiconductor as much as possible.

The first oxide layer 506_1 and the second oxide layer 506_3 which are provided above and below the oxide semiconductor layer 506_2 each serve as a barrier layer, and can prevent a trap level formed at an interface between the oxide stack 506 and each of the insulating layers which are in contact with the oxide stack 506 from adversely affecting the oxide semiconductor layer 506_2 which serves as a main carrier path in the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. The oxide layers in which oxygen vacancies are less likely to be generated than in the oxide semiconductor layer 506_2 are provided over and under and in contact with the oxide semiconductor layer 506_2 in the oxide stack 506, whereby oxygen vacancies in the oxide semiconductor layer 506_2 can be reduced. For example, in the oxide semiconductor layer 506_2, the absorption coefficient due to the localized levels, which is obtained by measurement by a constant photocurrent method (CPM) is set lower than $1 \times 10^{-3}$/cm, preferably lower than $1 \times 10^{-4}$/cm.

In addition, when the oxide semiconductor layer 506_2 is in contact with an insulating layer including a different constituent element, an interface state is sometimes formed at the interface of the two layers and the interface state forms a channel. At this time, a second transistor having a different threshold voltage appears, so that an apparent threshold voltage of the transistor is varied. However, since the first oxide layer 506_1 contains one or more kinds of metal elements forming the oxide semiconductor layer 506_2 in the oxide stack 506, an interface state is less likely to be formed at an interface between the first oxide layer 506_1 and the oxide semiconductor layer 506_2. Thus, providing the first oxide layer 506_1 makes it possible to reduce fluctuation in the electrical characteristics of the transistor, such as threshold voltage.

When a channel is formed at an interface between the gate insulating layer 510 and the oxide semiconductor layer 506_2, interface scattering occurs at the interface and the field-effect mobility of the transistor is decreased. However, since the second oxide layer 506_3 contains one or more kinds of metal elements forming the the oxide semiconductor layer 506_2 in the oxide stack 506, scattering of carriers is less likely to occur at an interface between the second oxide layer 506_3 and the the oxide semiconductor layer 506_2, and thus the field-effect mobility of the transistor can be increased.

Further, the first oxide layer 506_1 and the second oxide layer 506_3 each also serve as a barrier layer which suppresses formation of an impurity level due to the entry of the constituent elements of the insulating layers which are in contact with the oxide stack 506 (the insulating layer 504 and the gate insulating layer 510) into the oxide semiconductor layer 506_2.

For example, in the case of using a silicon-containing insulating layer as each of the insulating layer 504 or the gate insulating layer 510 which are in contact with the oxide stack 506, the silicon in the insulating layers or carbon which might be contained in the insulating layers enters the first oxide layer 506_1 or the second oxide layer 506_3 at a depth of several nanometers from the interface in some cases. An impurity such as silicon, carbon, or the like entering the oxide semiconductor layer 506_2 forms impurity states. The impurity states serve as a donor and generates an electron, so that the oxide semiconductor layer 506_2 may become n-type.

However, when the thicknesses of the first oxide layer 506_1 and the second oxide layer 506_3 are larger than several nanometers, the impurity such as silicon or carbon does not reach the oxide semiconductor layer 506_2, so that the influence of impurity levels is suppressed.

Here, the concentration of silicon in the oxide semiconductor layer 506_2 is lower than or equal to $1 \times 10^{18}$/cm$^3$, preferably lower than or equal to $3 \times 10^{17}$/cm$^3$. In addition, the concentration of carbon in the oxide semiconductor layer 506_2 is lower than or equal to $3 \times 10^{18}$/cm$^3$, preferably lower than or equal to $3 \times 10^{17}$/cm$^3$. It is particularly preferable to sandwich or surround the oxide semiconductor layer 506_2 serving as a carrier path by the first oxide layer 506_1 and the second oxide layer 506_3 in order to prevent entry of much silicon or carbon, which is a Group 14 element, to the oxide semiconductor layer 506_2. That is, the concentration of silicon and carbon contained in the oxide semiconductor layer 506_2 is preferably lower than that in the first oxide layer 506_1 and the second oxide layer 506_3.

Note that the impurity concentration of the oxide semiconductor layer can be measured by secondary ion mass spectrometry (SIMS).

If hydrogen or moisture is contained in the oxide semiconductor layer as an impurity, it can work as a donor and form an n-type region; therefore, in order to achieve a well-shaped structure, it is useful to provide a protective insulating layer (e.g. a silicon nitride layer) for preventing entry of hydrogen or moisture from the outside, above the oxide stack 506.

As illustrated in FIGS. 11A to 11D, trap levels derived from an impurity or a defect can be formed in the vicinity of the interfaces between the first and the second oxide layers and the insulating films such as the silicon oxide films. The first and the second oxide layers enable the oxide semiconductor layer and the trap states to be distanced from each other. However, in the case where an energy difference between EcS1 or EcS3 and EcS2 is small, electrons in the oxide semiconductor layer might reach the trap state by passing over the energy gap. When the electrons are captured by the trap state, they become negative fixed charge, so that the threshold voltage of the transistor shifts in the positive direction.

Thus, the energy gap between EcS1 and EcS2 and the energy gap between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

Each of the first oxide layer 506_1, the oxide semiconductor layer 506_2, and the second oxide layer 506_3 is formed using a sputtering target which contains at least indium (In) and with which a film can be formed by a sputtering method, preferably a DC sputtering method. When the sputtering target contains indium, the conductivity thereof is increased; therefore, film formation by a DC sputtering method is facilitated.

As a material forming the first oxide layer 506_1 and the second oxide layer 506_3, a material which is represented by an In-M-Zn oxide (M is a metal element such as Al, Ti, Ga, Ge, Y, Zr, Sn, La, Ce, or Hf) is used. As M, Ga is preferably used. However, a material with a high proportion of Ga, specifically the material represented as $InGa_xZn_yO_z$ with X exceeding 10, is not suitable because powder may be generated in the deposition and deposition by a DC sputtering method may become difficult.

Note that for each of the first oxide layer 506_1 and the second oxide layer 506_3, a material in which the proportion of indium in the atomic ratio is smaller than a material used for the oxide semiconductor layer 506_2 is used. The indium and gallium contents in the first oxide layer 404a and the second oxide layer 404c can be compared with each other by time-of-flight secondary ion mass spectrometry (also referred to as TOF-SIMS) or X-ray photoelectron spectrometry (also referred to as XPS).

When the first oxide layer 506_1 contains a constituent element (e.g. silicon) of the insulating layer 504 as an impurity, it might have an amorphous structure. Note that the oxide semiconductor layer 506_2 in which a channel is formed preferably has a crystal part. In the case where the oxide semiconductor layer 506_2 having a crystal part is stacked over the first oxide layer 506_1 having an amorphous structure, the oxide stack can be referred to as a hetero structure having different crystal structures.

In addition, the second oxide layer 506_3 may have an amorphous structure or include a crystal part. Formation of the second oxide layer 506_3 over the oxide semiconductor layer 506_2 having a crystal part allows the second oxide layer 506_3 to have a crystal structure. In this case, a boundary between the oxide semiconductor layer 506_2 and the second oxide layer 506_3 cannot be clearly identified by observation of the cross section with a transmission electron microscope (TEM) in some cases. Note that the second oxide layer 506_3 has lower crystallinity than the oxide semiconductor layer 506_2. Hence, it can be said that the boundary can be determined by the degree of crystallinity.

In the oxide stack 506, at least the oxide semiconductor layer 506_2 preferably contains CAAC-OS. For the details of the CAAC-OS, the description in Embodiment 3 can be referred to. When the oxide semiconductor layer 506_2 has high crystallinity like the CAAC-OS described above, the variation of the threshold voltage of the transistor can be reduced and the electric characteristics can be stable.

Next, band structures shown in FIGS. 11C and 11D will be described below.

Figure 11C:
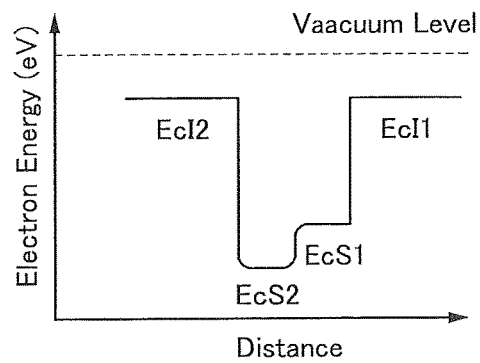
Figure 11D:
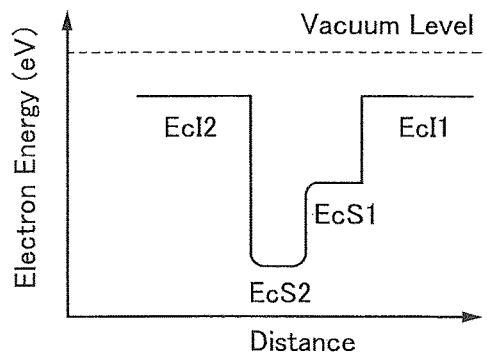

In FIGS. 11C and 11D, the vertical axis represents electron energy (eV) and the horizontal axis represents distance. Here, EcI1 and EcI2 represent energy at the minimum conduction band of the silicon oxide film, EcS1 represents energy at the minimum conduction band of the first oxide layer 506_1, and EcS2 represents energy at the minimum conduction band of the oxide semiconductor layer 506_2.

FIG. 11C is a modification example of the band structure shown in FIG. 11A. FIG. 11D is a modification example of the band structure shown in FIG. 11B. Specifically, FIGS. 11C and 11D show a band structure where EcS3 which represents the energy at the minimum conduction band of the second oxide layer 506_3 in FIGS. 11A and 11B is not provided, and EcS2 of the energy at the minimum conduction band on the EcI2 side is high.

For example, in the transistor illustrated in FIG. 10A, the upper surface of the oxide stack 506, that is, the second oxide layer 506_3 is sometimes etched when the source electrode layer 508b and the drain electrode layer 509b are formed. However, when the second oxide layer 506_3 is formed, a mixed layer of the oxide semiconductor layer 506_2 and the second oxide layer 506_3 might be formed on the upper surface of the oxide semiconductor layer 506_2.

In the case where the oxide semiconductor layer 506_2 contains In—Ga—Zn oxide at an atomic ratio of In:Ga:Zn=1:1:1 or In:Ga:Zn=3:1:2 and the second oxide layer 506_3 contains In—Ga—Zn oxide at an atomic ratio of In:Ga:Zn=1:3:2 or In:Ga:Zn=1:6:4, the second oxide layer 506_3 contains more Ga than the oxide semiconductor layer 506_2 does; accordingly, a $GaO_x$ layer or a mixed layer which contains more Ga than the oxide semiconductor layer 506_2 does may be formed on the upper surface the oxide semiconductor layer 506_2.

Therefore, it is possible that the band structure illustrated in FIGS. 11C and 11D be realized as the result of increase in EcS2 of the energy at the minimum conduction band on the EcI2 side.

As described above, an oxide stack is provided to be in contact with an oxide semiconductor to form an oxide stack including the oxide semiconductor and the oxide, whereby it is possible to prevent an impurity such as hydrogen or moisture or an impurity contained in an insulating film in contact with the oxide semiconductor from entering the oxide semiconductor film and forming a carrier.

In addition, with such a structure of the oxide stack, interface scattering hardly occurs at the interface between the oxide and the oxide semiconductor. Thus, motion of carriers is not impeded at the interface, resulting in higher electric-field mobility of the transistor. In addition, the formation of the oxide in contact with the oxide semiconductor can prevent impurities from entering the oxide semiconductor film, so that the transistor including the oxide semiconductor can have stable electrical characteristics.

Figure 12A:
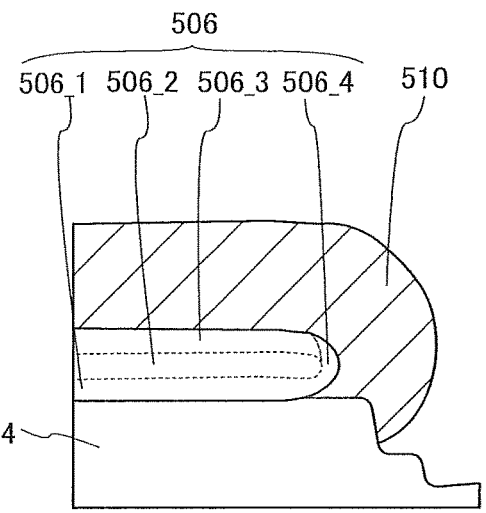
FIGS. 12A to 12C each illustrate a cross-sectional structure of an oxide stack of one embodiment of the present invention.
Figure 12B:
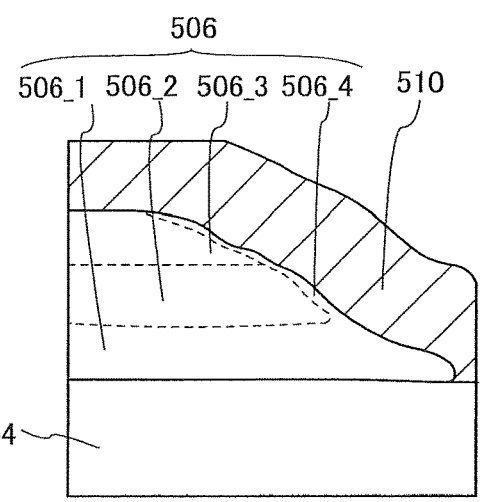
Figure 12C:
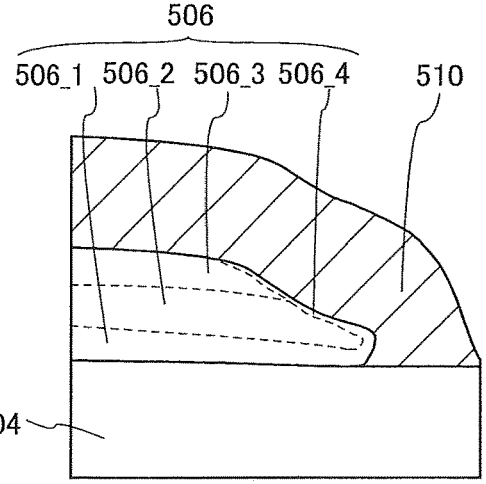

In addition, the oxide stack 506 including the oxide semiconductor layer 506_2 can have the structure shown in FIGS. 12A to 12C.

FIGS. 12A to 12C illustrate examples of a cross-sectional structure of the oxide stack 506. The oxide stack 506 includes the first oxide layer 506_1 over the insulating layer 504, the oxide semiconductor layer 506_2 over the first oxide layer 506_1, the second oxide layer 506_3 over the oxide semiconductor layer 506_2, and a third oxide layer 506_4 in contact with side surfaces of the oxide semiconductor layer 506_2 and the second oxide layer 506_3. In this case, the oxide semiconductor layer 506_2 is surrounded by the first oxide layer 506_1, the second oxide layer 506_3, and the third oxide layer 506_4. The third oxide layer 506_4 is in contact with the gate insulating layer 510.

The oxide stack 506 illustrated in FIG. 12A has a curved surface with one arbitrary curvature radius or plural arbitrary curvature radii. In this case, at least a part of the surface of the third oxide layer 506_4 in contact with the gate insulating layer 510 is a curved surface.

The third oxide layer 506_4 includes, for example, a material that can be applied to the first oxide layer 506_1. The third oxide layer 506_4 is formed as follows: for example, when the first oxide layer 506_1, the second oxide layer 506_3, and the third oxide layer 506_4 are etched by a dry etching method or the like, a reaction product of the first oxide layer 506_1 is attached to the side surfaces of the oxide semiconductor layer 506_2 and the second oxide layer 506_3.

In some cases, the insulating layer 504 is overetched and formed in a stepped shape in the cross section when the third oxide layer 506_4 is formed.

Note that the first oxide layer 506_1, the second oxide layer 506_3, and the third oxide layer 506_4 cannot be strictly distinguished from each other in some cases. For that reason, the oxide semiconductor layer 506_2 can be said to be surrounded by the oxide.

Alternatively, the oxide stack 506 may have a structure illustrated in FIG. 12B. The oxide stack 506 illustrated in FIG. 12B has an inclined region at an end portion. By formation of the inclined region at the end portion, the coverage with the gate insulating layer 510 can be improved. Alternatively, a structure in which part of the inclined region is cut as illustrated in FIG. 12C may be employed.

As described above, the semiconductor device in this embodiment includes the oxide stack which is a stacked-layer including the oxide semiconductor layer and the oxide layers formed over and under and in contact with the oxide semiconductor layer, and in the cross section of the oxide stack, the oxide stack has a curved surface or an inclined region. Because the cross-section of the oxide stack has a curved surface or an inclined curve surface, the coverage of the oxide stack with a layer to be formed thereover can be improved. Accordingly, a film can be formed uniformly over the oxide stack, and thus, intrusion of an impurity element into the oxide stack from a region with low film density or a region without the film formed can be inhibited so that deterioration of characteristics of the semiconductor device can be prevented. Therefore, a semiconductor device having stable characteristics can be provided.

This embodiment can be freely combined with any of the other embodiments in this specification.

Embodiment 5

In this embodiment, the deterioration mechanism of an oxide semiconductor layer will be described with reference to FIG. 13, FIG. 14, FIGS. 15A to 15C, FIGS. 16A and 16B, FIGS. 17A and 17B, FIGS. 18A and 18B, and FIGS. 19A and 19B.

In order to improve reliability of a transistor including an oxide semiconductor (OS) layer, it is important to clarify a factor that affects the reliability. Here, in order to improve reliability of the transistor including an oxide semiconductor layer, the deterioration mechanism model described below was made.

Note that an oxygen vacancy of the oxide semiconductor layer forms a deep level DOS in the oxide semiconductor layer. In order to reduce the deep level DOS, it is important to make a state in which the oxide semiconductor layer contains oxygen in excess of the stoichiometric composition and to provide the oxide semiconductor layer to supply oxygen for repairing the oxygen vacancy from outside.

When a positive gate BT (+GBT: positive gate bias temperature) test is performed on the transistor including the oxide semiconductor layer, the threshold voltage (Vth) shifts in the positive direction as compared to the initial Vg-Id characteristics. In addition, when a negative gate BT (−GBT: negative gate bias temperature) test has been performed on the transistor on which a positive gate BT test is performed, the Vg-Id characteristics shifts in the negative direction. In this manner, the threshold voltage of the transistor becomes alternately positive and negative, which is associated with alternation of a positive gate BT test and a negative gate BT test (see FIG. 13).

Figure 13:
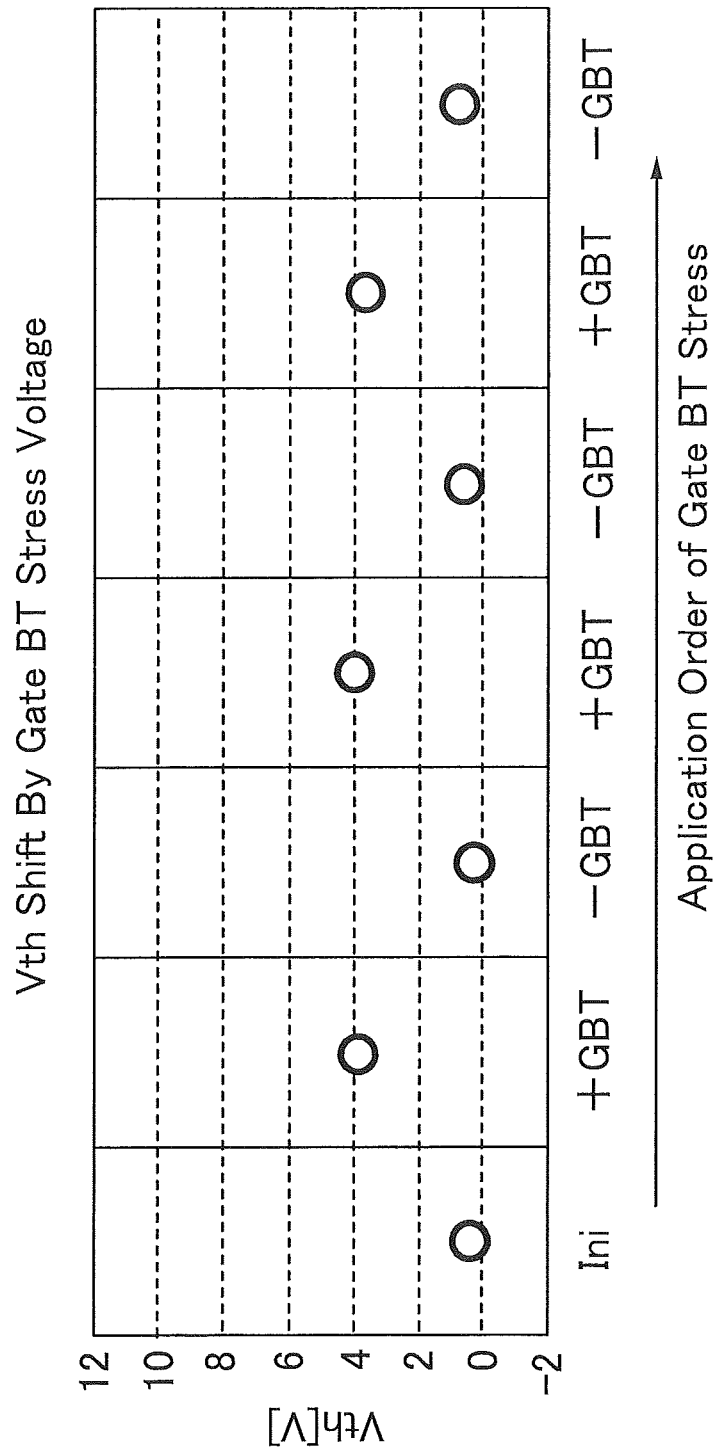
FIG. 13 illustrates a change in electrical characteristics of a transistor including an oxide semiconductor layer.

FIG. 13 suggests that the change of Vg-Id characteristics of the transistor including the oxide semiconductor layer relates to not a fixed charge but a level (trap level).

Figure 14:
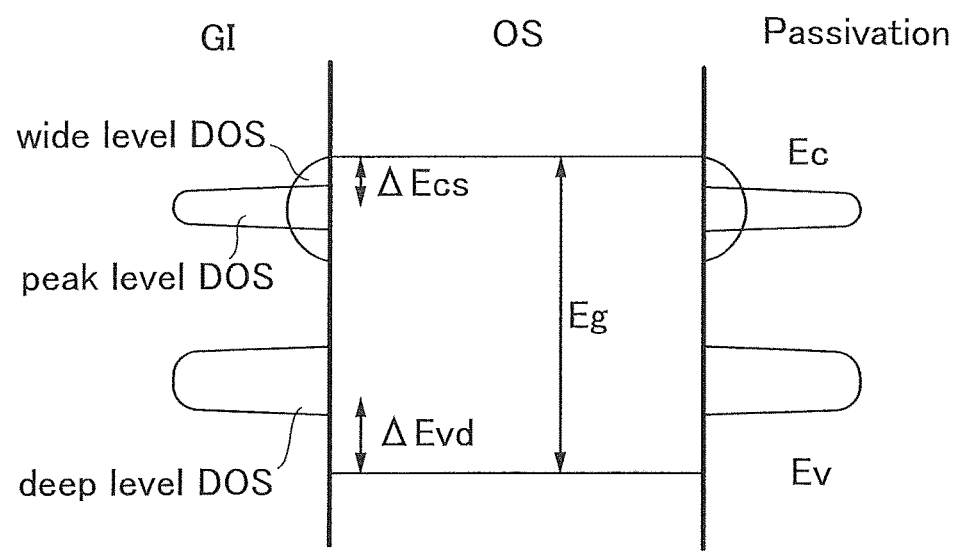
FIG. 14 is an energy band diagram in a transistor including an oxide semiconductor layer.

FIG. 14 is a model of an energy band diagram of the transistor including the oxide semiconductor layer. Note that FIG. 14 shows a state where a gate voltage is not applied. In FIG. 14, three kinds of defect states (DOS) were assumed in the oxide semiconductor layer, at the interface between the oxide semiconductor layer and a gate insulating film ("GI"), and the interface between the oxide semiconductor layer and a protective insulating film ("Passivation"). As defect states, there are two kinds of shallow level DOS and one kind of deep level DOS. Note that each of the defect states has an energy distribution. Here, the first shallow level (wide level DOS) has a large energy distribution, and the second shallow level (peak level DOS) has a small energy distribution. In addition, a difference (ΔEvd) between energy at the top of the valence band and energy of the deep level DOS is larger than a difference (ΔEcs) between energy at the minimum conduction band and energy of the peak level DOS.

For example, the shallow level becomes neutral when its energy is higher than Fermi energy and is negatively charged when its energy is lower than Fermi energy. On the other hand, the deep level is positively charged when the energy is larger than Fermi energy and becomes neutral when the energy is smaller than Fermi energy.

Figure 15A:
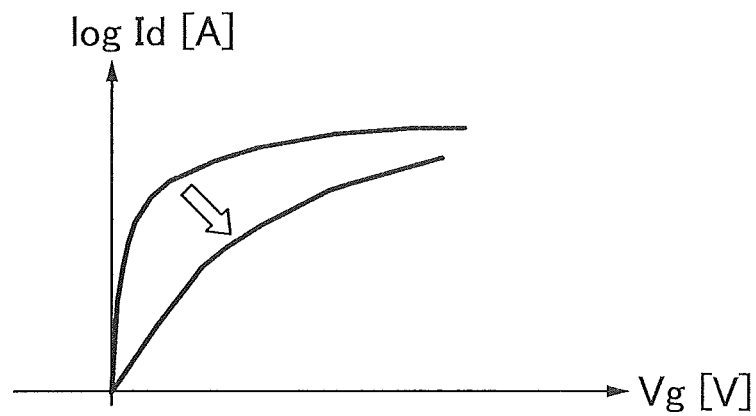
FIGS. 15A to 15C are deterioration modes of a transistor including an oxide semiconductor layer.
Figure 15B:
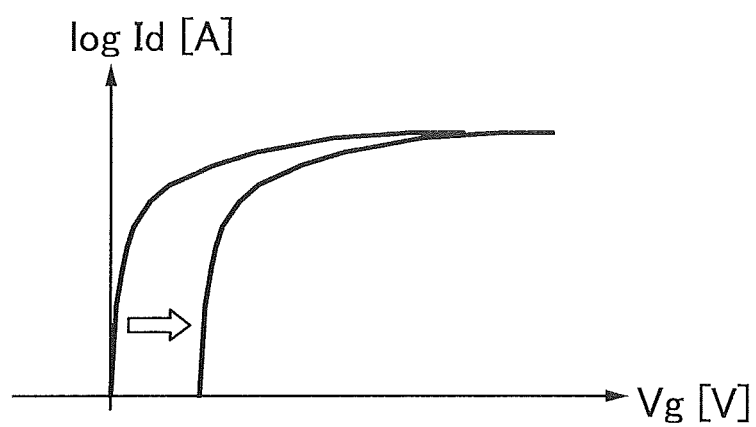
Figure 15C:
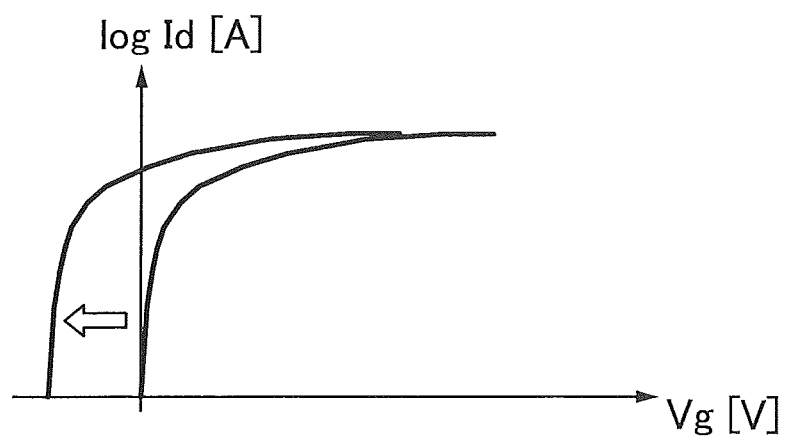
Figure 16A:
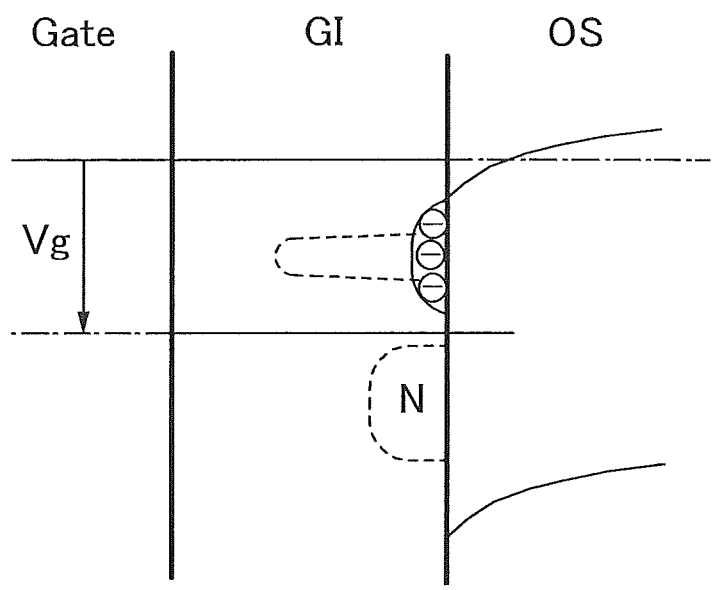
FIGS. 16A and 16B are an energy band diagram of a transistor including an oxide semiconductor layer, and a diagram showing the corresponding deterioration model.
Figure 16B:
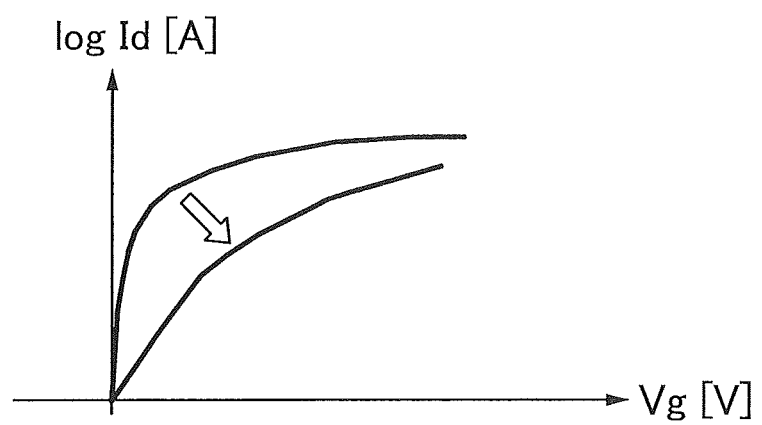

FIGS. 15A to 15C each show a deterioration mode of Vg-Id characteristics of the transistor including the oxide semiconductor layer. The transistor including the oxide semiconductor layer has three kinds of deterioration modes. Specifically, FIG. 15A shows a deterioration mode in which the on-state current is decreased, FIG. 15B shows a deterioration mode in which the threshold voltage shifts in the positive direction, and FIG. 15C shows a deterioration mode in which the threshold voltage shifts in the negative direction.

What types of defect states cause such deterioration modes of the transistor including the oxide semiconductor layer will be explained below.

Firstly, the decrease of on-state current shown in FIG. 15A is explained. When Vg-Id characteristics are measured, as a gate voltage increases, electrons are trapped by the wide level DOS (see FIG. 16A). At this time, the trapped electrons do not contribute to electric conduction, so that the on-state current of the transistor is decreased, i.e., the line is crushed (see FIG. 16B). Therefore, the decrease of on-state current of the transistor, which is one of the deterioration modes, is probably caused due to the wide level DOS. Note that N in the figures means Neutral.

Next, the shift of the threshold voltage to the positive side when a positive gate BT test is performed will be explained with reference to FIGS. 17A and 17B.

Figure 17A:
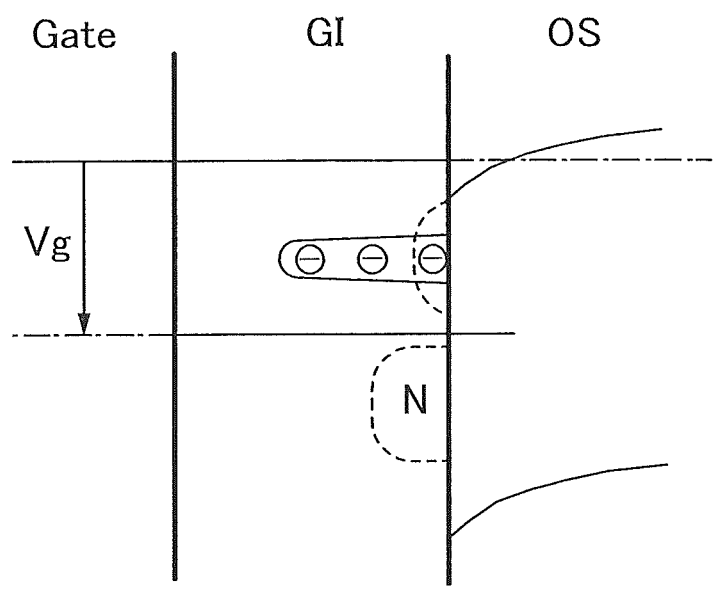
FIGS. 17A and 17B are an energy band diagram of a transistor including an oxide semiconductor layer, and a diagram showing the corresponding deterioration model.
Figure 17B:
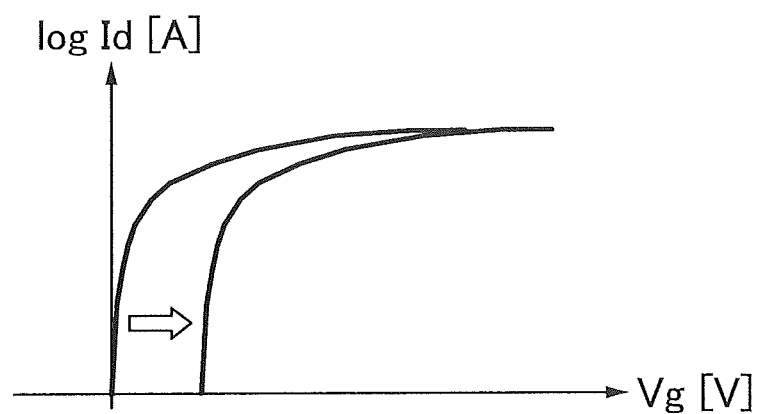

When a positive gate BT test is performed, electrons induced by a positive gate voltage are trapped by the peak level DOS (see FIG. 17A). The electrons trapped at the time of the positive gate BT test, i.e., negative charges, have a long relaxation time and thus behave like fixed charges. Due to the negative charges, even after the gate voltage (bias) is off, a state equal to a state in which a negative voltage is effectively applied occurs. Therefore, when the electric characteristics of the transistor are measured after the positive gate BT test, the threshold voltage of the transistor characteristics (Vg-Id characteristics) shifts in the positive direction (see FIG. 17B).

Next, the shift of the threshold voltage to the negative side when a negative gate BT test is performed will be explained with reference to FIGS. 18A and 18B.

Figure 18A:
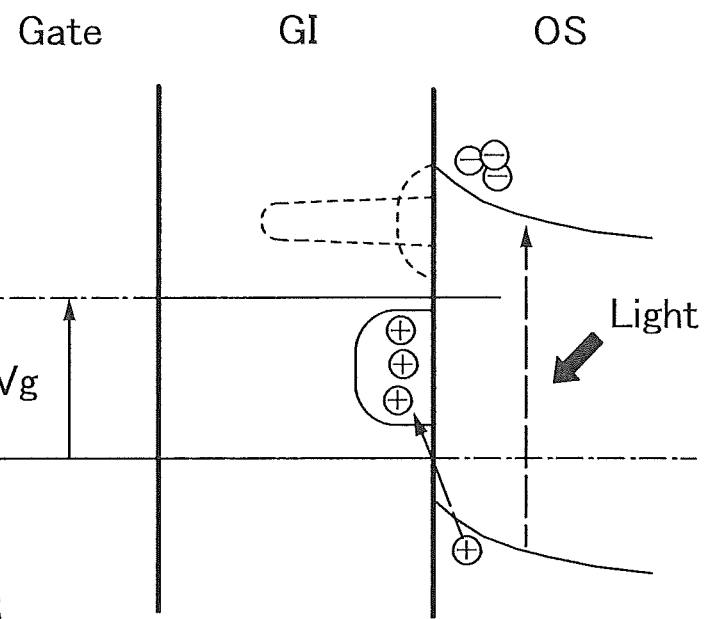
FIGS. 18A and 18B are an energy band diagram of a transistor including an oxide semiconductor layer, and a diagram showing the corresponding deterioration model.
Figure 18B:
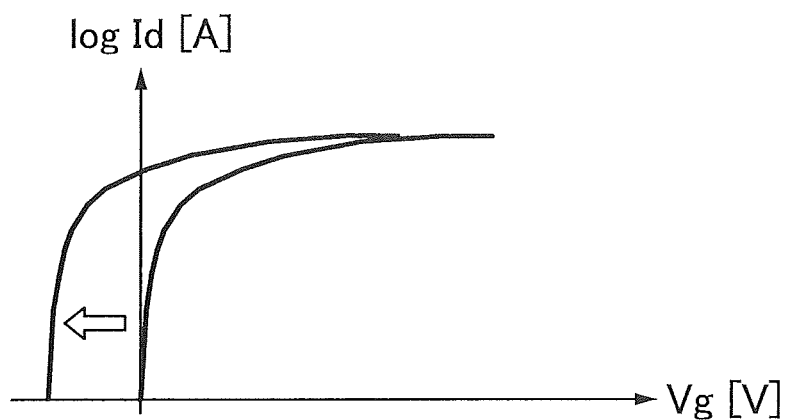

When a negative gate voltage Vg is applied to the transistor and the transistor is irradiated with light in a negative gate BT test, holes, that is, positive charges are trapped by the deep level DOS (see FIG. 18A). Since a difference between energy at the minimum conduction band (Ec) and energy of the deep level DOS is larger and a difference between energy at the top of the valence band (Ev) and energy of the deep level DOS is large, it takes a long time before holes are induced. In addition, holes in the oxide semiconductor layer have a large effective mass, and holes are hardly injected even from a drain electrode. The positive charges have a long relaxation time and thus behave like a fixed charge. Due to the positive charges, even after the gate voltage (bias) is off, a state equal to a state in which a positive voltage is effectively applied occurs. Therefore, when the electric characteristics of the transistor are measured after the negative gate BT test, the threshold voltage of the transistor characteristics (Vg-Id characteristics) shifts in the negative direction (see FIG. 18B).

Figure 19A:
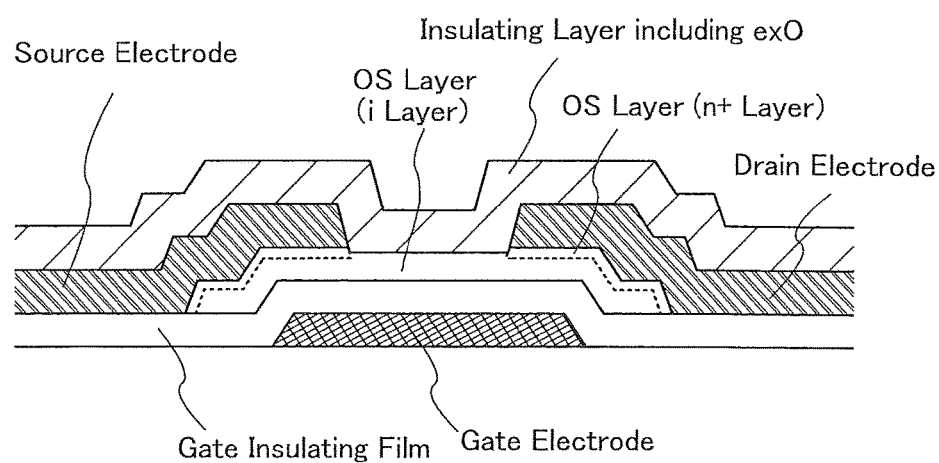
FIGS. 19A and 19B each illustrate a cross-sectional structure of a transistor including an oxide semiconductor layer.
Figure 19B:
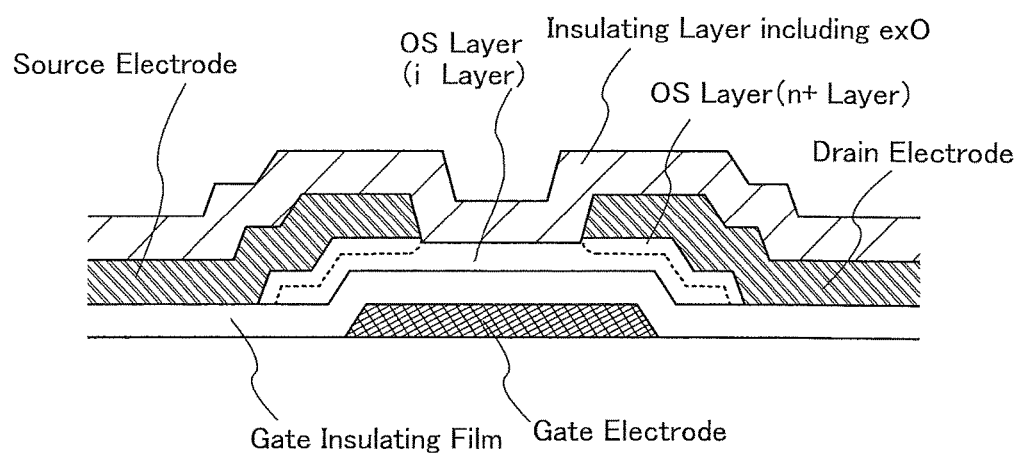

Next, an n-type region in which an oxide semiconductor layer is in contact with a source electrode and a drain electrode will be described with reference to FIGS. 19A and 19B. FIGS. 19A and 19B are cross-sectional views of transistors including an oxide semiconductor layer. The transistor includes a gate electrode, a gate insulating film formed over the gate electrode, an oxide semiconductor layer formed over the gate insulating film, a source electrode and a drain electrode formed over the oxide semiconductor layer, and an insulating film (exO containing insulating film) formed over the oxide semiconductor layer, the source electrode, and the drain electrode.

The oxide semiconductor layer is formed, and then the source electrode and the drain electrode are formed to be in contact with the oxide semiconductor layer. For example, when the source electrode and the drain electrode are formed by a sputtering method, plasma damage to the oxide semiconductor layer or collision of atoms or molecules of a material used for the source electrode and the drain electrode due to the sputtering makes part of the oxide semiconductor layer n-type, so that an n-type region ($n^+$ layer) is formed.

In addition, the n-type region is also formed by heat treatment after the source electrode and the drain electrode are formed. For example, by the heat treatment, hydrogen enters the position of an oxygen vacancy in the oxide semiconductor layer (VoH is formed) or In contained in the oxide semiconductor layer is reduced, so that the n-type region is formed.

On the other hand, in a region of the oxide semiconductor layer in which the source electrode and the drain electrode are not formed, i.e., a region where a channel is formed, an insulating film containing excess oxygen (exO containing insulating film) is formed to be in contact with the oxide semiconductor layer. Thus, by performing heat treatment after the insulating film containing excess oxygen is formed, oxygen vacancies are repaired by the excess oxygen (exO) in the oxide semiconductor layer and reduced, whereby the oxide semiconductor layer becomes i-type (i layer). Note that the cross-sectional view in FIG. 19A is different from the cross-sectional view in FIG. 19B in the position of an n-channel region ($n^+$ region). The n-channel region ($n^+$ region) may be formed in a different part of the oxide semiconductor layer, depending on a material of the source electrode and the drain electrode, conditions of heat treatment in a manufacturing process of the transistor, or the like.

Note that when the oxide semiconductor layer is an In—Ga—Zn oxide, oxygen which is bonded to indium whose bond energy with oxygen is low is easily released (i.e., In-Vo is easily formed). Note that the peak level DOS probably relates to In-VoH and may form an n-type region. The wide level DOS probably relates to In-Vo-HO—Si. The deep level DOS probably relates to In-Vo-In.

In order to reduce the density of defect states in an oxide semiconductor layer, it is important to reduce oxygen vacancies (Vo). Specifically, oxygen vacancies can be reduced by preventing entry of Si into the oxide semiconductor layer or by being repaired by excess oxygen. In addition, since VoH is contributed to formation of a shallow level which is a defect state, it is preferable to reduce hydrogen in the oxide semiconductor layer.

Embodiment 6

A display device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console, and the like. Examples of these electronic devices are illustrated in FIGS. 20A to 20C and FIGS. 21A to 21C.

Figure 20A:
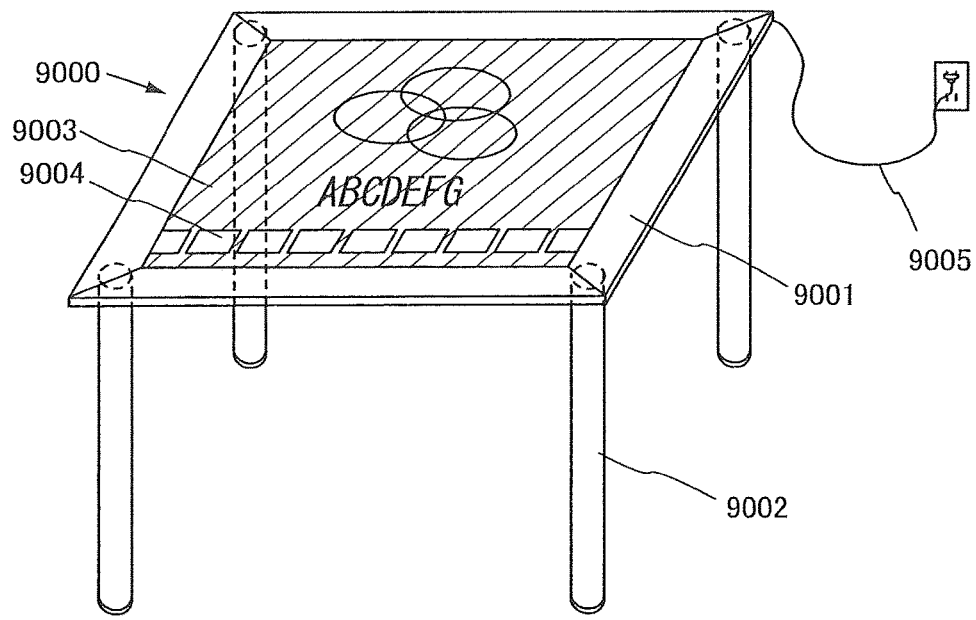
FIGS. 20A to 20C each illustrate an electronic device including a display device of one embodiment of the present invention.

FIG. 20A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The display device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of the display device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 20B:
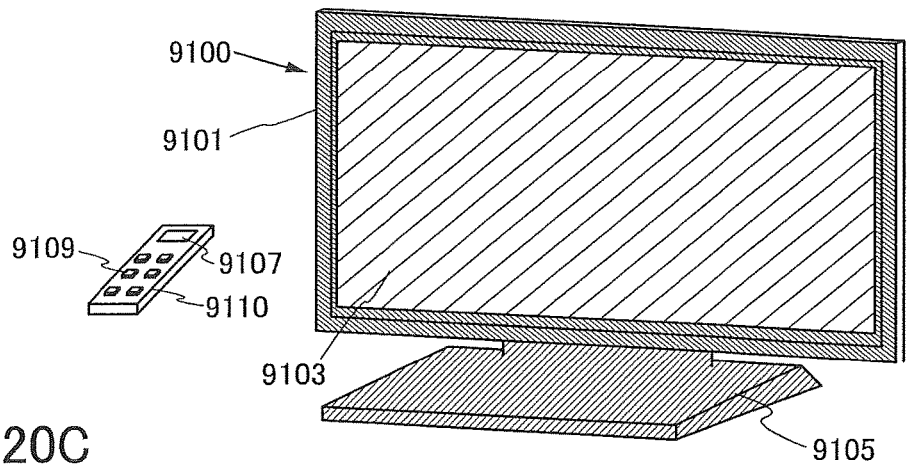

FIG. 20B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 20B is provided with a receiver, a modem, and the like. With the receiver, general television broadcasts can be received in the television device 9100. Further, when the television device 9100 is connected to a communication network by wired or wireless connection vithe modem, one-way (from a transmitter to a receiver) or two-way (between a transmitter and a receiver or between receivers) data communication can be performed.

Any of the display devices described in the above embodiments can be used for the display portions 9103 and 9107. Thus, the television set can have high display quality.

Figure 20C:
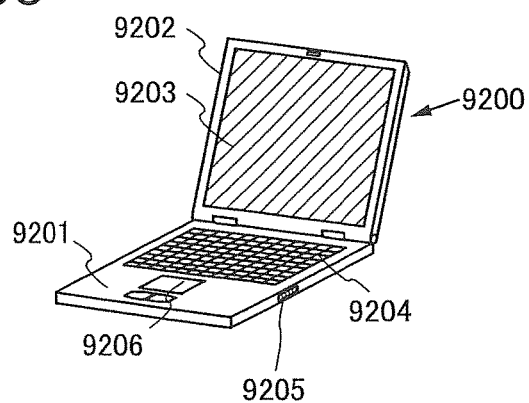

FIG. 20C illustrates a computer, which includes a main body 9201, a housing 9202, a display portion 9203, a keyboard 9204, an external connection port 9205, a pointing device 9206, and the like.

Any of the display devices described in the above embodiments can be used for the display portion 9203. Thus, the display quality of the computer can be improved.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 21A:
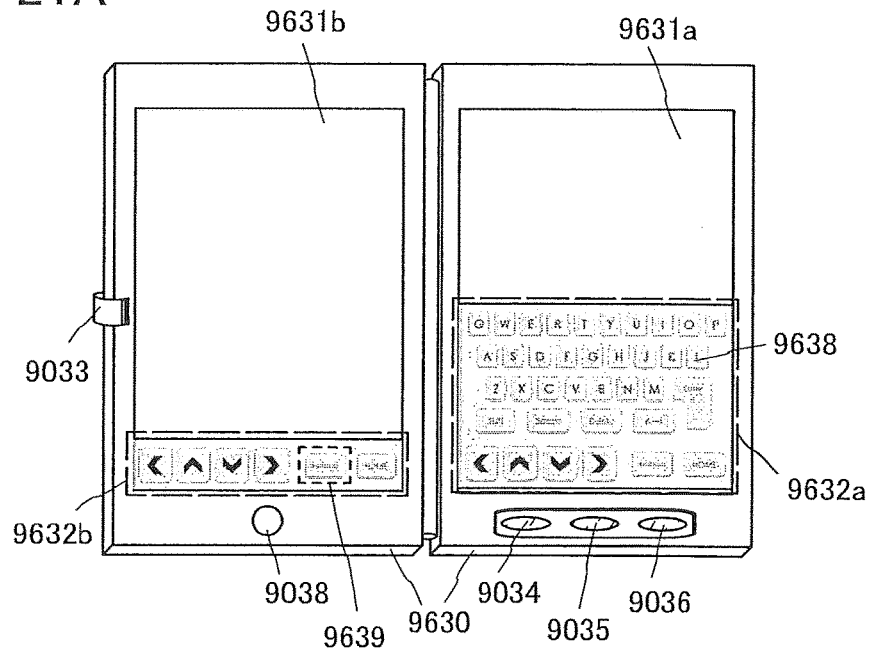
FIGS. 21A to 21C illustrate an electronic device including a display device of one embodiment of the present invention.
Figure 21B:
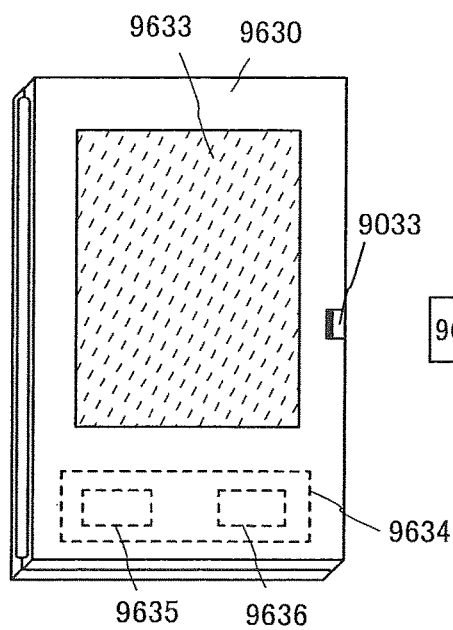

FIGS. 21A and 21B illustrate a tablet terminal that can be folded. In FIG. 21A, the tablet terminal is open and includes a housing 9630, a display portion 9631a, a display portion 9631b, a display mode switch 9034, a power switch 9035, a power saver switch 9036, a fastener 9033, and an operation switch 9038.

Any of the display devices described in the above embodiments can be used for the display portion 9631a and the display portion 9631b. Thus, the display quality of the tablet terminal can be improved.

Part of the display portion 9631a can be a touch panel region 9632a, and data can be input by touching operation keys 9638 that are displayed. Note that FIGS. 21A and 21B show, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display area in FIG. 21A, one embodiment of the present invention is not limited to this example. The display portion 9631a and the display portion 9631b may have different areas or different display quality. For example, one of them may be a display panel that can display higher-definition images than the other.

In FIG. 21B, the tablet terminal is folded and includes the housing 9630, a solar cell 9633, and a charge and discharge control circuit 9634. Note that FIG. 21B shows an example of a structure of the charge and discharge control circuit 9634 that includes a battery 9635 and a DCDC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet terminal illustrated in FIGS. 21A and 21B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 21C:
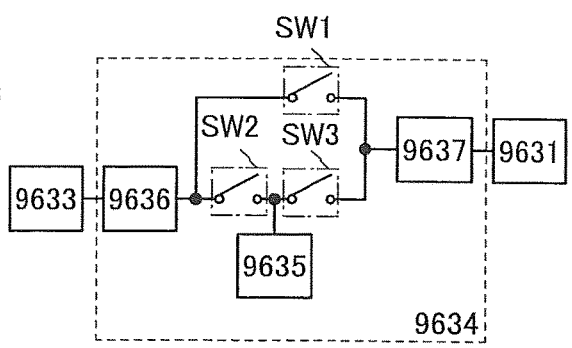

The structure and the operation of the charge and discharge control circuit 9634 illustrated in FIG. 21B will be described with reference to a block diagram in FIG. 21C. FIG. 21C illustrates the solar cell 9633, the battery 9635, the DC-to-DC converter 9636, a converter 9637, switches SW1 to SW3, and a display portion 9631. The battery 9635, the DC-to-DC converter 9636, the converter 9637, and the switches SW1 to SW3 correspond to the charge and discharge control circuit 9634 illustrated in FIG. 21B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar battery 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or thermoelectric conversion element (Peltier element). For example, the battery 9635 may be charged with a non-contact power transmission module capable of performing charging by transmitting and receiving electric power wirelessly (without contact), or any of the other charge means used in combination.

Note that the structures and the like described in this embodiment can be combined as appropriate with any of the structures and the like described in the other embodiments.

This application is based on Japanese Patent Application serial No. 2012-259260 filed with Japan Patent Office on Nov. 28, 2012, the entire contents of which are hereby incorporated by reference.

What is claimed is:

1. A semiconductor device comprising:
a first input terminal to which a start pulse signal is input;
a second input terminal to which a clock signal is input;
a third input terminal to which a reset signal is input;
a fourth input terminal to which an inverted start pulse signal is input;
a first output terminal from which a pulse signal is output;
a second output terminal from which a pulse signal is output;
a first transistor;
a second transistor;
a third transistor;
a fourth transistor;
a fifth transistor;
a sixth transistor;
a seventh transistor;
an eighth transistor; and
a capacitor,
wherein one of a source electrode and a drain electrode of the first transistor is electrically connected to the first input terminal,
wherein the other of the source electrode and the drain electrode of the first transistor is electrically connected to a gate electrode of the second transistor, one electrode of the capacitor, and one of a source electrode and a drain electrode of the fifth transistor,
wherein a gate electrode of the first transistor is electrically connected to the one of the source electrode and the drain electrode of the first transistor,
wherein one of a source electrode and a drain electrode of the second transistor is electrically connected to the second input terminal,
wherein the other of the source electrode and the drain electrode of the second transistor is electrically connected to one of a source electrode and a drain electrode of the third transistor, a gate electrode of the eighth transistor, and the first output terminal,
wherein the other of the source electrode and the drain electrode of the third transistor is electrically connected to one of a source electrode and a drain electrode of the fourth transistor,
wherein a gate electrode of the third transistor is electrically connected to the third input terminal,
wherein the other of the source electrode and the drain electrode of the fourth transistor is electrically connected to a wiring to which a first low power supply potential is applied,
wherein a gate electrode of the fourth transistor is electrically connected to the fourth input terminal,
wherein the other of the source electrode and the drain electrode of the fifth transistor is electrically connected to one of a source electrode and a drain electrode of the sixth transistor,
wherein a gate electrode of the fifth transistor is electrically connected to the third input terminal,
wherein the other of the source electrode and the drain electrode of the sixth transistor is electrically connected to a wiring to which a second low power supply potential lower than the first low power supply potential is applied,
wherein a gate electrode of the sixth transistor is electrically connected to the fourth input terminal,
wherein one of a source electrode and a drain electrode of the seventh transistor is electrically connected to a wiring to which a first high power supply potential is applied,
wherein the other of the source electrode and the drain electrode of the seventh transistor is electrically connected to one of a source electrode and a drain electrode of the eighth transistor and a second output circuit,
wherein a gate electrode of the seventh transistor is electrically connected to one of a source electrode and a drain electrode of the seventh transistor,
wherein the other of the source electrode and the drain electrode of the eighth transistor is electrically connected to a wiring to which the second low power supply potential is applied,
wherein the other electrode of the capacitor is electrically connected to a first output circuit,
wherein the start pulse signal includes the first low power supply potential and a high power supply potential, and
wherein the second low power supply potential is applied to the gate electrode of the second transistor through the fifth transistor and the sixth transistor, when the start pulse signal is the first low power supply potential.

2. The semiconductor device according to claim 1, wherein a channel formation region of each of the first transistor, the second transistor, the third transistor, the fourth transistor, the fifth transistor, the sixth transistor, the seventh transistor, and the eighth transistor comprises an oxide semiconductor layer.

3. The semiconductor device according to claim 1, wherein the first high power supply potential is lower than the second high power supply potential.

4. A display device comprising:
the semiconductor device according to claim 1; and
a pixel circuit where data writing and storing of a data signal are controlled by the semiconductor device.

5. An electronic device comprising the display device according to claim 4.

* * * * *